(12) United States Patent
Chen et al.

(10) Patent No.: US 11,257,906 B2
(45) Date of Patent: Feb. 22, 2022

(54) HIGH SURFACE DOPANT CONCENTRATION FORMATION PROCESSES AND STRUCTURES FORMED THEREBY

(71) Applicant: Taiwan Semiconductor Manufacturing Co., Ltd., Hsinchu (TW)

(72) Inventors: Chia-Cheng Chen, Hsinchu (TW); Liang-Yin Chen, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 78 days.

(21) Appl. No.: 16/889,356

(22) Filed: Jun. 1, 2020

(65) Prior Publication Data

US 2020/0295135 A1    Sep. 17, 2020

Related U.S. Application Data

(60) Continuation of application No. 16/568,676, filed on Sep. 12, 2019, now Pat. No. 10,672,871, which is a
(Continued)

(51) Int. Cl.
*H01L 29/08* (2006.01)
*H01L 29/36* (2006.01)
(Continued)

(52) U.S. Cl.
CPC .... *H01L 29/0847* (2013.01); *H01L 21/02576* (2013.01); *H01L 21/02579* (2013.01);
(Continued)

(58) Field of Classification Search
CPC ................ H01L 29/0847; H01L 29/36; H01L 29/41791; H01L 29/456
See application file for complete search history.

(56) References Cited

U.S. PATENT DOCUMENTS

| 5,409,843 A | 4/1995 | Yamauchi et al. |
| 9,105,490 B2 | 8/2015 | Wang et al. |

(Continued)

FOREIGN PATENT DOCUMENTS

| KR | 20160040411 A | 4/2016 |
| KR | 20170074344 A | 6/2017 |

*Primary Examiner* — Douglas M Menz
(74) *Attorney, Agent, or Firm* — Slater Matsil, LLP

(57) ABSTRACT

Embodiments disclosed herein relate generally to forming a source/drain region with a high surface dopant concentration at an upper surface of the source/drain region, to which a conductive feature may be formed. In an embodiment, a structure includes an active area on a substrate, a dielectric layer over the active area, and a conductive feature through the dielectric layer to the active area. The active area includes a source/drain region. The source/drain region includes a surface dopant region at an upper surface of the source/drain region, and includes a remainder portion of the source/drain region having a source/drain dopant concentration. The surface dopant region includes a peak dopant concentration proximate the upper surface of the source/drain region. The peak dopant concentration is at least an order of magnitude greater than the source/drain dopant concentration. The conductive feature contacts the source/drain region at the upper surface of the source/drain region.

20 Claims, 18 Drawing Sheets

Related U.S. Application Data division of application No. 15/825,533, filed on Nov. 29, 2017, now Pat. No. 10,510,838.

(51) Int. Cl.

| | | |
|---|---|---|
| *H01L 29/417* | (2006.01) | |
| *H01L 29/165* | (2006.01) | |
| *H01L 29/78* | (2006.01) | |
| *H01L 21/02* | (2006.01) | |
| *H01L 21/223* | (2006.01) | |
| *H01L 21/324* | (2006.01) | |
| *H01L 29/45* | (2006.01) | |
| *H01L 29/66* | (2006.01) | |

(52) U.S. Cl.
CPC ........ *H01L 21/2236* (2013.01); *H01L 21/324* (2013.01); *H01L 29/165* (2013.01); *H01L 29/36* (2013.01); *H01L 29/41791* (2013.01); *H01L 29/456* (2013.01); *H01L 29/665* (2013.01); *H01L 29/785* (2013.01); *H01L 29/7851* (2013.01); *H01L 29/66492* (2013.01)

(56) References Cited

U.S. PATENT DOCUMENTS

| | | |
|---|---|---|
| 9,236,267 B2 | 1/2016 | De et al. |
| 9,236,300 B2 | 1/2016 | Liaw |
| 9,406,804 B2 | 8/2016 | Huang et al. |
| 9,443,769 B2 | 9/2016 | Wang et al. |
| 9,520,482 B1 | 12/2016 | Chang et al. |
| 9,548,366 B1 | 1/2017 | Ho et al. |
| 9,576,814 B2 | 2/2017 | Wu et al. |
| 9,831,183 B2 | 11/2017 | Lin et al. |
| 9,859,386 B2 | 1/2018 | Ho et al. |
| 2012/0273880 A1 | 11/2012 | Teng et al. |
| 2014/0131735 A1 | 5/2014 | Hoentschel et al. |
| 2014/0197458 A1 | 7/2014 | Ching et al. |
| 2014/0361384 A1 | 12/2014 | Liu |
| 2016/0099150 A1 | 4/2016 | Tsai et al. |
| 2016/0380081 A1 | 12/2016 | Hsu et al. |
| 2017/0179253 A1 | 6/2017 | Cha et al. |

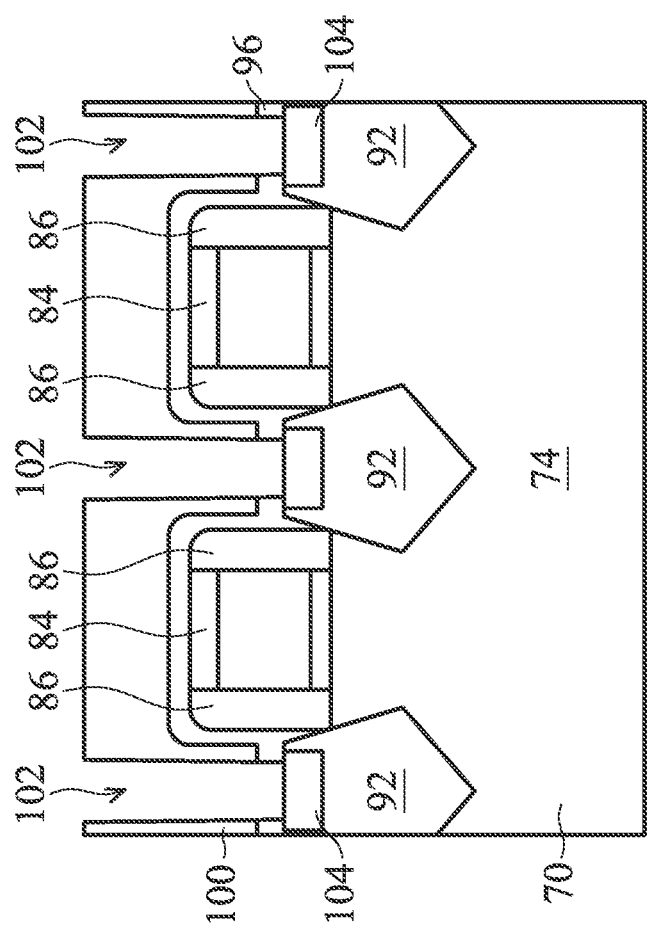
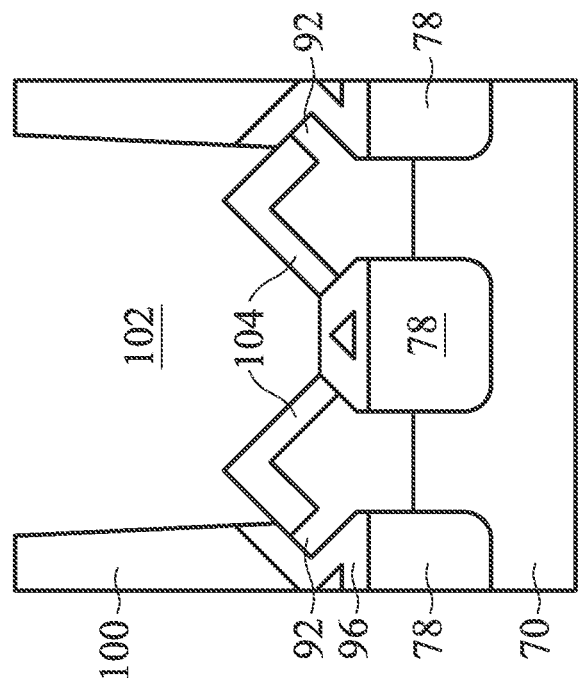
FIG. 10A
FIG. 10B

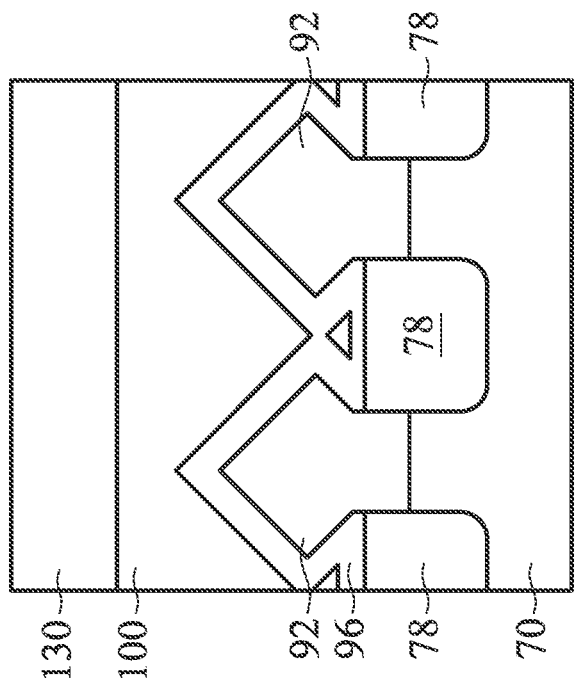
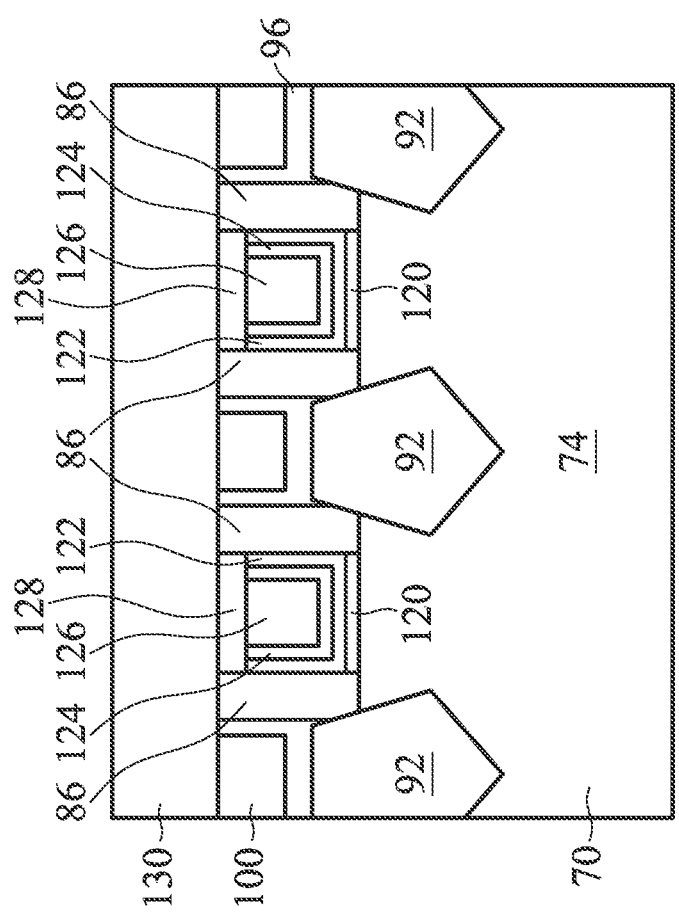
FIG. 13A
FIG. 13B

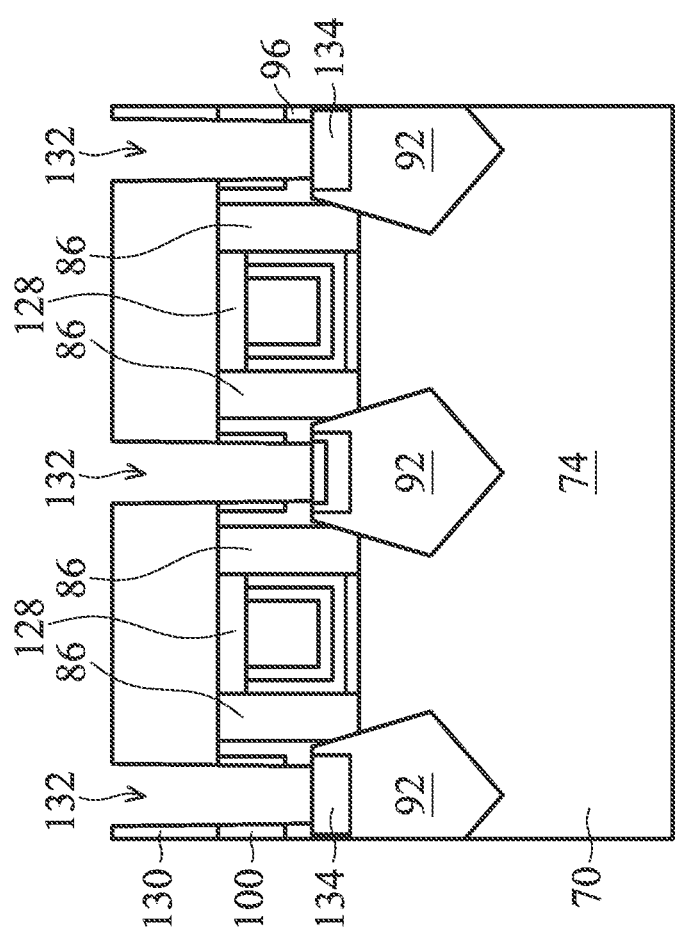
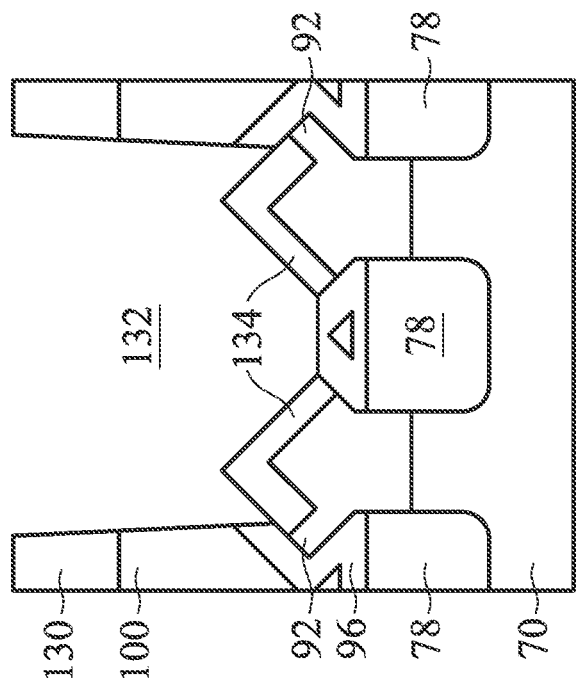
FIG. 14A
FIG. 14B

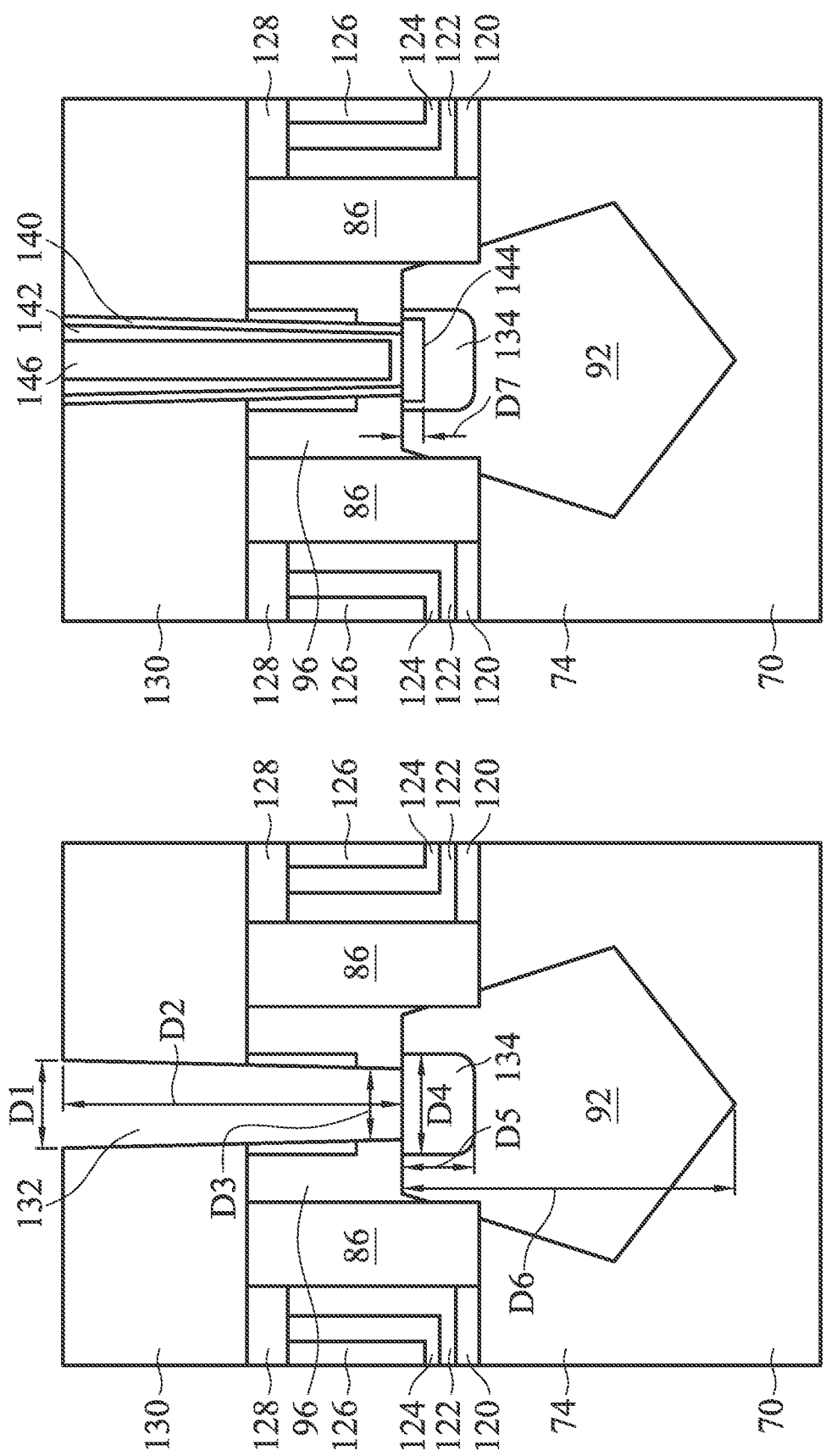

HIGH SURFACE DOPANT CONCENTRATION FORMATION PROCESSES AND STRUCTURES FORMED THEREBY

PRIORITY CLAIM AND CROSS-REFERENCE

This application is a continuation of U.S. patent application Ser. No. 16/568,676, entitled "High Surface Dopant Concentration Formation Processes and Structures Formed Thereby," filed on Sep. 12, 2019, which is a divisional of U.S. patent application Ser. No. 15/825,533, entitled "High Surface Dopant Concentration Formation Processes and Structures Formed Thereby," filed on Nov. 29, 2017, now U.S. Pat. No. 10,510,838 issued Dec. 17, 2019, each application is hereby incorporated herein by reference.

BACKGROUND

As the semiconductor industry has progressed into nanometer technology process nodes in pursuit of higher device density, higher performance, and lower costs, challenges from both fabrication and design issues have resulted in the development of three-dimensional designs, such as a Fin Field Effect Transistor (FinFET). FinFET devices typically include semiconductor fins with high aspect ratios and in which channel and source/drain regions are formed. A gate is formed over and along the sides of the fin structure (e.g., wrapping) utilizing the advantage of the increased surface area of the channel to produce faster, more reliable, and better-controlled semiconductor transistor devices. However, with the decreasing in scaling, new challenges are presented.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 2A-B, 3A-B, 4A-B, 5A-B, 6A-B, 7A-B, 8A-B, 9A-B, 10A-B, and 11A-B are cross-sectional views of respective intermediate structures at intermediate stages in an example process of forming a semiconductor device in accordance with some embodiments.

FIGS. 12A-B, 13A-B, 14A-B, and 15A-B are cross-sectional views of respective intermediate structures at intermediate stages in another example process of forming a semiconductor device in accordance with some embodiments.

FIGS. 16 and 17 are portions of the cross-sectional views of FIGS. 14A and 15A, respectively, to further illustrate additional details in accordance with some embodiments.

DETAILED DESCRIPTION

Figure 1:
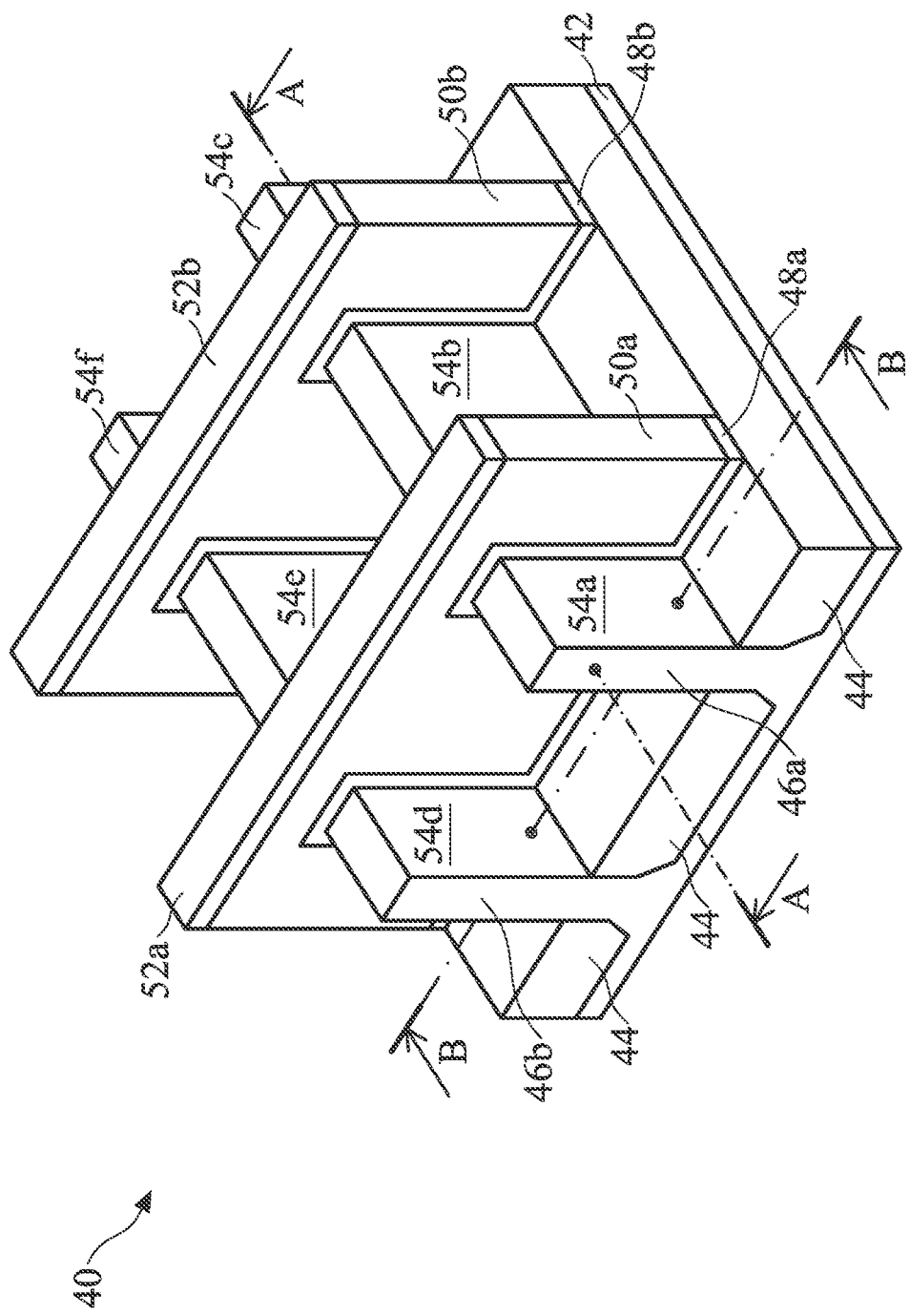
FIG. 1 is a three-dimensional view of example simplified Fin Field Effect Transistors (FinFETs) in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments disclosed herein relate generally to forming a source/drain region with a high surface dopant concentration at an upper surface of the source/drain region, to which a conductive feature may be formed. The high surface dopant concentration can be formed using plasma doping (PLAD). The high surface dopant concentration at the upper surface of the source/drain region can be an order of magnitude or more greater than a dopant concentration of a remainder of the source/drain region. A contact resistance of a conductive feature formed to the high surface dopant concentration in the source/drain region can be reduced due to the presence of the high surface dopant concentration, among other benefits.

The foregoing broadly outlines some aspects of embodiments described herein. Some embodiments described herein are described in the context of Fin Field Effect Transistors (FinFETs). Implementations of some aspects of the present disclosure may be used in other processes and/or in other devices. For example, other example devices can include planar FETs, Horizontal Gate All Around (HGAA) FETs, Vertical Gate All Around (VGAA) FETs, nanowire channel FETs, and other devices. Further, the high surface dopant concentration may be implemented in other regions of devices, such as an anode region or cathode region of a diode. Some variations of the example methods and structures are described. A person having ordinary skill in the art will readily understand other modifications that may be made that are contemplated within the scope of other embodiments. Although method embodiments may be described in a particular order, various other method embodiments may be performed in any logical order and may include fewer or more steps than what is described herein.

FIG. 1 illustrates an example of simplified FinFETs 40 in a three-dimensional view. Other aspects not illustrated in or described with respect to FIG. 1 may become apparent from the following figures and description. The structure in FIG. 1 may be electrically connected or coupled in a manner to operate as, for example, one transistor or more, such as four transistors.

The FinFETs 40 comprise fins 46a and 46b on a semiconductor substrate 42. The semiconductor substrate 42 includes isolation regions 44, and the fins 46a and 46b each protrude above and from between neighboring isolation regions 44. Gate dielectrics 48a and 48b are along sidewalls and over top surfaces of the fins 46a and 46b, and gate electrodes 50a and 50b are over the gate dielectrics 48a and 48b, respectively. Further, masks 52a and 52b are over the gate electrodes 50a and 50b, respectively. Source/drain regions 54a-f are disposed in respective regions of the fins 46a and 46b. Source/drain regions 54a and 54b are disposed in opposing regions of the fin 46a with respect to the gate dielectric 48a and gate electrode 50a. Source/drain regions 54b and 54c are disposed in opposing regions of the fin 46a with respect to the gate dielectric 48b and gate electrode 50b. Source/drain regions 54d and 54e are disposed in opposing regions of the fin 46b with respect to the gate dielectric 48a and gate electrode 50a. Source/drain regions 54e and 54f are disposed in opposing regions of the fin 46b with respect to the gate dielectric 48b and gate electrode 50b.

In some examples, four transistors may be implemented by including: (1) source/drain regions 54a and 54b, gate dielectric 48a, and gate electrode 50a; (2) source/drain regions 54b and 54c, gate dielectric 48b, and gate electrode 50b; (3) source/drain regions 54d and 54e, gate dielectric 48a, and gate electrode 50a; and (4) source/drain regions 54e and 54f, gate dielectric 48b, and gate electrode 50b. As indicated, some source/drain regions may be shared between various transistors, and other source/drain regions that are not illustrated as being shared may be shared with neighboring transistors that are not illustrated, for example. In some examples, various ones of the source/drain regions may be connected or coupled together such that FinFETs are implemented as two functional transistors. For example, if neighboring (e.g., as opposed to opposing) source/drain regions 54a-f are electrically connected, such as through coalescing the regions by epitaxial growth (e.g., source/drain regions 54a and 54d being coalesced, source/drain regions 54b and 54e being coalesced, etc.), two functional transistors may be implemented. Other configurations in other examples may implement other numbers of functional transistors.

FIG. 1 further illustrates reference cross-sections that are used in later figures. Cross-section A-A is in a plane along, e.g., channels in the fin 46a between opposing source/drain regions 54a-c. Cross-section B-B is in a plane perpendicular to cross-section A-A and is across source/drain region 54a in fin 46a and across source/drain region 54d in fin 46b. Subsequent figures refer to these reference cross-sections for clarity. The following figures ending with an "A" designation illustrate cross-sectional views at various instances of processing corresponding to cross-section A-A, and the following figures ending with a "B" designation illustrate cross-sectional views at various instances of processing corresponding to cross-section B-B. In some figures, some reference numbers of components or features illustrated therein may be omitted to avoid obscuring other components or features; this is for ease of depicting the figures.

FIGS. 2A-B through 11A-B are cross-sectional views of respective intermediate structures at intermediate stages in an example process of forming a semiconductor device in accordance with some embodiments. Aspects of FIGS. 2A-B through 9A-B are applicable to a gate-first process and to a replacement gate process as described herein. FIGS. 10A-B and 11A-B illustrate further aspects of a gate-first process as described herein.

Figure 2A:
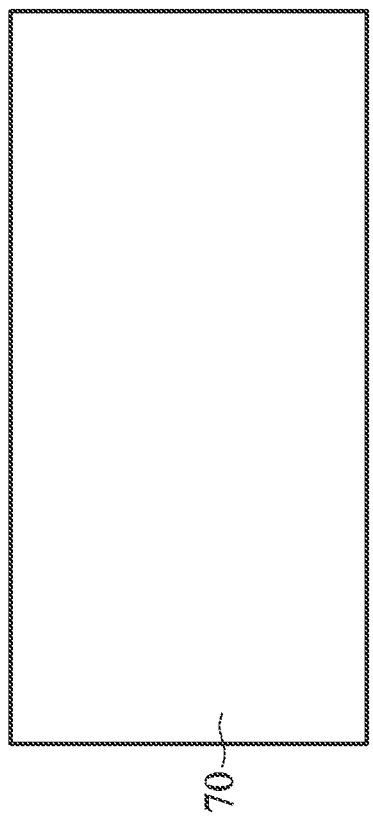
Figure 2B:
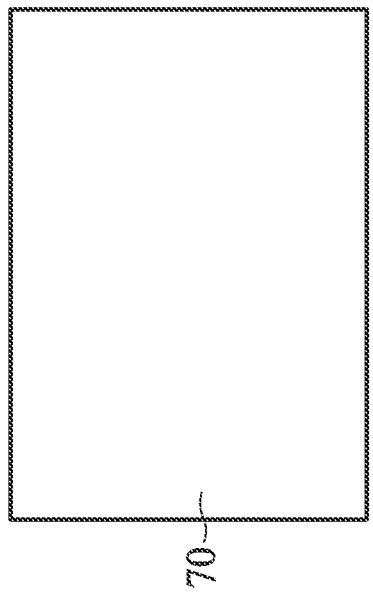

FIGS. 2A and 2B illustrate a semiconductor substrate 70. The semiconductor substrate 70 may be or include a bulk semiconductor substrate, a semiconductor-on-insulator (SOI) substrate, or the like, which may be doped (e.g., with a p-type or an n-type dopant) or undoped. Generally, an SOI substrate comprises a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of the semiconductor substrate may include an elemental semiconductor including silicon (Si) or germanium (Ge); a compound semiconductor including silicon carbide, gallium arsenic, gallium phosphide, indium phosphide, indium arsenide, or indium antimonide; an alloy semiconductor including SiGe, GaAsP, AlInAs, AlGaAs, GaInAs, GaInP, or GaInAsP; or a combination thereof.

Figure 3B:
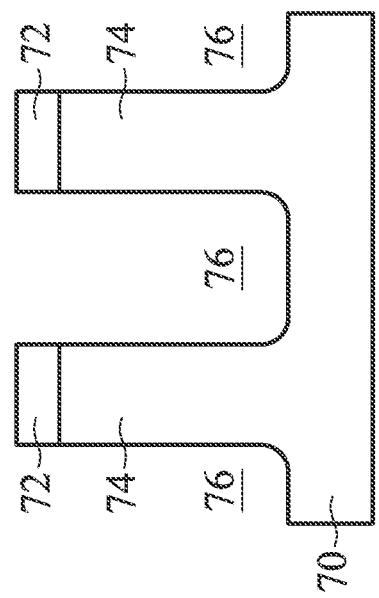
Figure 3A:
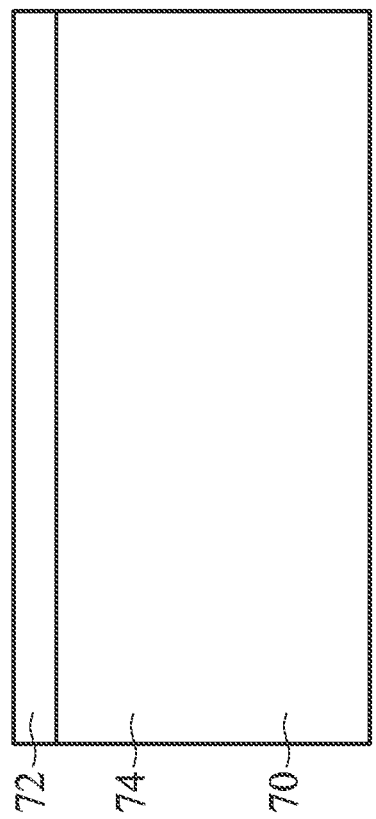

FIGS. 3A and 3B illustrate the formation of fins 74 in the semiconductor substrate 70. In some examples, a mask 72 (e.g., a hard mask) is used in forming the fins 74. For example, one or more mask layers are deposited over the semiconductor substrate 70, and the one or more mask layers are then patterned into the mask 72. In some examples, the one or more mask layers may include or be silicon nitride, silicon oxynitride, silicon carbide, silicon carbon nitride, the like, or a combination thereof, and may be deposited by chemical vapor deposition (CVD), physical vapor deposition (PVD), atomic layer deposition (ALD), or another deposition technique. The one or more mask layers may be patterned using photolithography. For example, a photo resist can be formed on the one or more mask layers, such as by using spin-on coating, and patterned by exposing the photo resist to light using an appropriate photomask. Exposed or unexposed portions of the photo resist may then be removed depending on whether a positive or negative resist is used. The pattern of the photo resist may then be transferred to the one or more mask layers, such as by using a suitable etch process, which forms the mask 72. The etch process may include a reactive ion etch (RIE), neutral beam etch (NBE), inductive coupled plasma (ICP) etch, the like, or a combination thereof. The etching may be anisotropic. Subsequently, the photo resist is removed in an ashing or wet strip processes, for example.

Using the mask 72, the semiconductor substrate 70 may be etched such that trenches 76 are formed between neighboring pairs of fins 74 and such that the fins 74 protrude from the semiconductor substrate 70. The etch process may include a RIE, NBE, ICP etch, the like, or a combination thereof. The etching may be anisotropic.

Figure 4B:
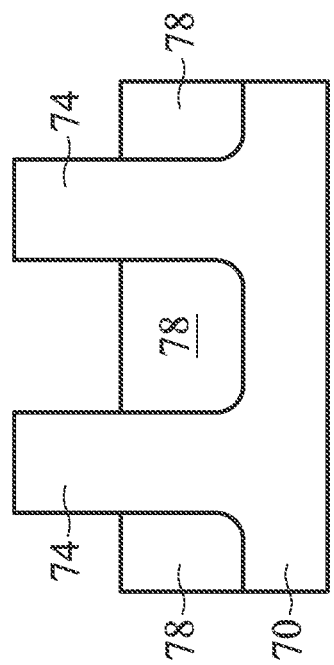
Figure 4A:
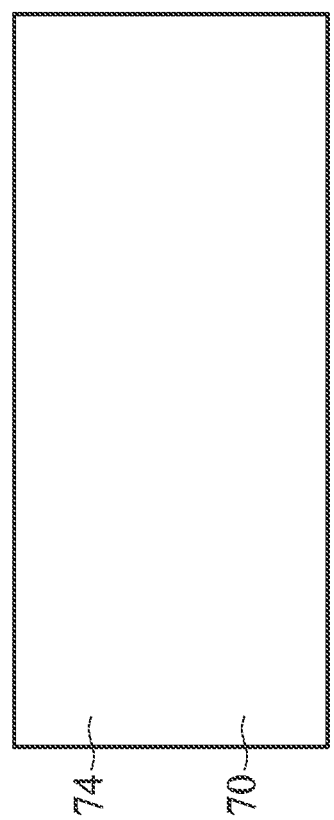

FIGS. 4A and 4B illustrate the formation of isolation regions 78, each in a corresponding trench 76. The isolation regions 78 may include or be an insulating material such as an oxide (such as silicon oxide), a nitride, the like, or a combination thereof, and the insulating material may be formed by a high density plasma CVD (HDP-CVD), a flowable CVD (FCVD) (e.g., a CVD-based material deposition in a remote plasma system and post curing to make it convert to another material, such as an oxide), the like, or a combination thereof. Other insulating materials formed by any acceptable process may be used. In the illustrated embodiment, the isolation regions 78 include silicon oxide that is formed by a FCVD process. A planarization process, such as a Chemical Mechanical Polish (CMP), may remove any excess insulating material and any remaining mask (e.g., used to etch the trenches 76 and form the fins 74) to form top surfaces of the insulating material and top surfaces of the fins 74 to be coplanar. The insulating material may then be recessed to form the isolation regions 78. The insulating material is recessed such that the fins 74 protrude from between neighboring isolation regions 78, which may, at least in part, thereby delineate the fins 74 as active areas on the semiconductor substrate 70. The insulating material may be recessed using an acceptable etch process, such as one that is selective to the material of the insulating material. For example, a chemical oxide removal using a CERTAS® etch or an Applied Materials SICONI tool or dilute hydrofluoric (dHF) acid may be used. Further, top surfaces of the isolation regions 78 may have a flat surface as illustrated, a convex surface, a concave surface (such as dishing), or a combination thereof, which may result from an etch process.

A person having ordinary skill in the art will readily understand that the processes described with respect to FIGS. 2A-B through 4A-B are just examples of how fins 74 may be formed. In other embodiments, a dielectric layer can be formed over a top surface of the semiconductor substrate 70; trenches can be etched through the dielectric layer; homoepitaxial structures can be epitaxially grown in the trenches; and the dielectric layer can be recessed such that the homoepitaxial structures protrude from the dielectric layer to form fins. In still other embodiments, heteroepitaxial structures can be used for the fins. For example, the fins 74 can be recessed (e.g., after planarizing the insulating material of the isolation regions 78 and before recessing the insulating material), and a material different from the fins may be epitaxially grown in their place. In an even further embodiment, a dielectric layer can be formed over a top surface of the semiconductor substrate 70; trenches can be etched through the dielectric layer; heteroepitaxial structures can be epitaxially grown in the trenches using a material different from the semiconductor substrate 70; and the dielectric layer can be recessed such that the heteroepitaxial structures protrude from the dielectric layer to form fins. In some embodiments where homoepitaxial or heteroepitaxial structures are epitaxially grown, the grown materials may be in situ doped during growth, which may obviate prior implanting of the fins although in situ and implantation doping may be used together. Still further, it may be advantageous to epitaxially grow a material for an n-type device different from the material for a p-type device.

Figure 5A:
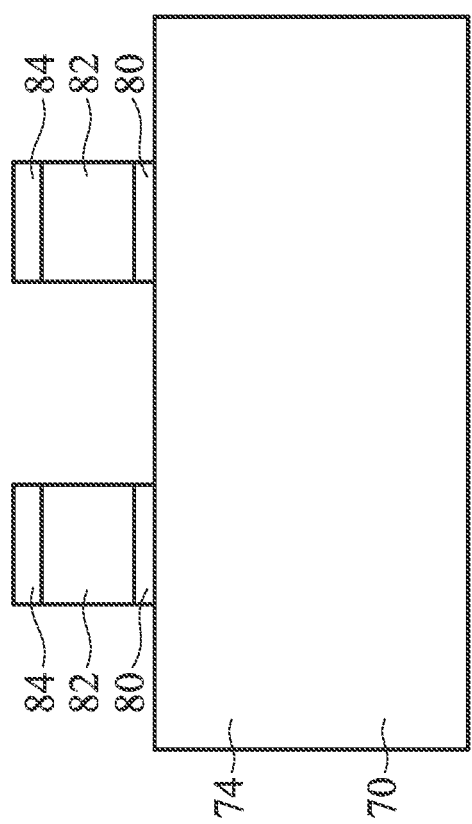
Figure 5B:
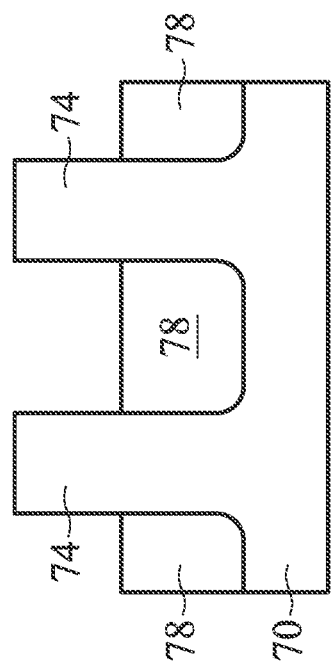

FIGS. 5A and 5B illustrate the formation of gate stacks, or more generically, a gate structure, on the fins 74. The gate stacks are over and extend laterally perpendicularly to the fins 74. Each gate stack comprises a dielectric layer 80, a gate layer 82, and a mask 84. The gate stacks can be operational gate stacks in a gate-first process or can be dummy gate stacks in a replacement gate process.

In a gate-first process, the dielectric layer 80 may be a gate dielectric, and the gate layer 82 may be a gate electrode. The gate dielectrics, gate electrodes, and mask 84 for the gate stacks may be formed by sequentially forming respective layers, and then patterning those layers into the gate stacks. For example, a layer for the gate dielectrics may include or be silicon oxide, silicon nitride, a high-k dielectric material, the like, or multilayers thereof. A high-k dielectric material may have a k value greater than about 7.0, and may include a metal oxide of or a metal silicate of hafnium (Hf), aluminum (Al), zirconium (Zr), lanthanum (La), magnesium (Mg), barium (Ba), titanium (Ti), lead (Pb), multilayers thereof, or a combination thereof. The layer for the gate dielectrics may be thermally and/or chemically grown on the fins 74, or conformally deposited, such as by plasma-enhanced CVD (PECVD), ALD, molecular-beam deposition (MBD), or another deposition technique. A layer for the gate electrodes may include or be silicon (e.g., polysilicon, which may be doped or undoped), a metal-containing material (such as titanium, tungsten, aluminum, ruthenium, or the like), or a combination thereof (such as a silicide (which may be subsequently formed) or multiple layers thereof). The layer for the gate electrodes may be deposited by CVD, PVD, or another deposition technique. A layer for the mask 84 may include or be silicon nitride, silicon oxynitride, silicon carbon nitride, the like, or a combination thereof, deposited by CVD, PVD, ALD, or another deposition technique. The layers for the mask 84, gate electrodes, and gate dielectrics may then be patterned, for example, using photolithography and one or more etch processes, like described above, to form the mask 84, gate layers 82, and dielectric layers 80 for each gate stack.

In a replacement gate process, the dielectric layer 80 may be an interfacial dielectric, and the gate layer 82 may be a dummy gate. The interfacial dielectric, dummy gate, and mask 84 for the gate stacks may be formed by sequentially forming respective layers, and then patterning those layers into the gate stacks. For example, a layer for the interfacial dielectrics may include or be silicon oxide, silicon nitride, the like, or multilayers thereof, and may be thermally and/or chemically grown on the fins 74, or conformally deposited, such as by PECVD, ALD, or another deposition technique. A layer for the dummy gates may include or be silicon (e.g., polysilicon) or another material deposited by CVD, PVD, or another deposition technique. A layer for the mask 84 may include or be silicon nitride, silicon oxynitride, silicon carbon nitride, the like, or a combination thereof, deposited by CVD, PVD, ALD, or another deposition technique. The layers for the mask 84, dummy gates, and interfacial dielectrics may then be patterned, for example, using photolithography and one or more etch processes, like described above, to form the mask 84, gate layer 82, and dielectric layers 80 for each gate stack.

In some embodiments, after forming the gate stacks, lightly doped drain (LDD) regions (not specifically illustrated) may be formed in the active areas. For example, dopants may be implanted into the active areas using the gate stacks as masks. Example dopants for the LDD regions can include or be, for example, boron for a p-type device and phosphorus or arsenic for an n-type device, although other dopants may be used. The LDD regions may have a dopant concentration in a range from about $10^{15}$ cm$^{-3}$ to about $10^{17}$ cm$^{-3}$.

Figure 6A:
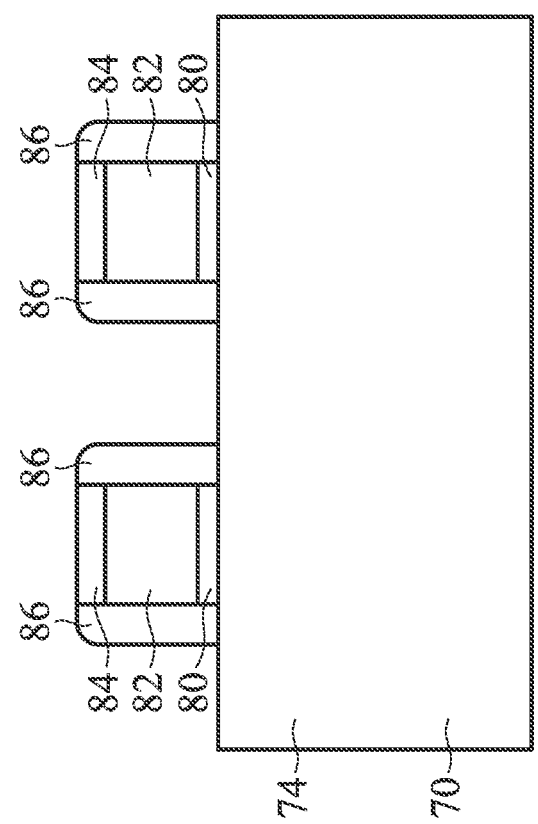
Figure 6B:
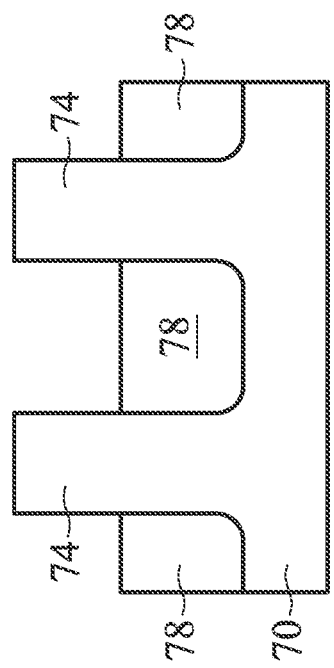

FIGS. 6A and 6B illustrate the formation of gate spacers 86. Gate spacers 86 are formed along sidewalls of the gate stacks (e.g., sidewalls of the dielectric layers 80, gate layers 82, and masks 84) and over the fins 74. Residual gate spacers 86 may also be formed along sidewalls of the fins 74, for example, depending on the height of the fins 74 above the isolation regions 78. The gate spacers 86 may be formed by conformally depositing one or more layers for the gate spacers 86 and anisotropically etching the one or more layers, for example. The one or more layers for the gate spacers 86 may include or be silicon oxygen carbide, silicon nitride, silicon oxynitride, silicon carbon nitride, the like, multi-layers thereof, or a combination thereof, and may be deposited by CVD, ALD, or another deposition technique. The etch process can include a RIE, NBE, or another etch process.

Figure 7B:
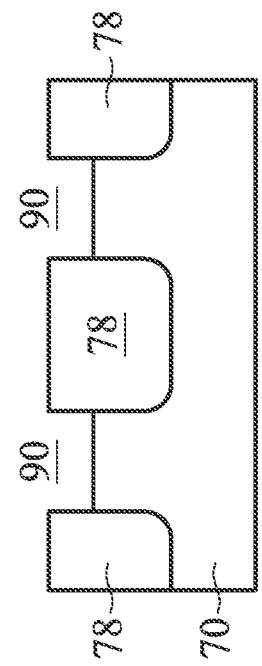
Figure 7A:
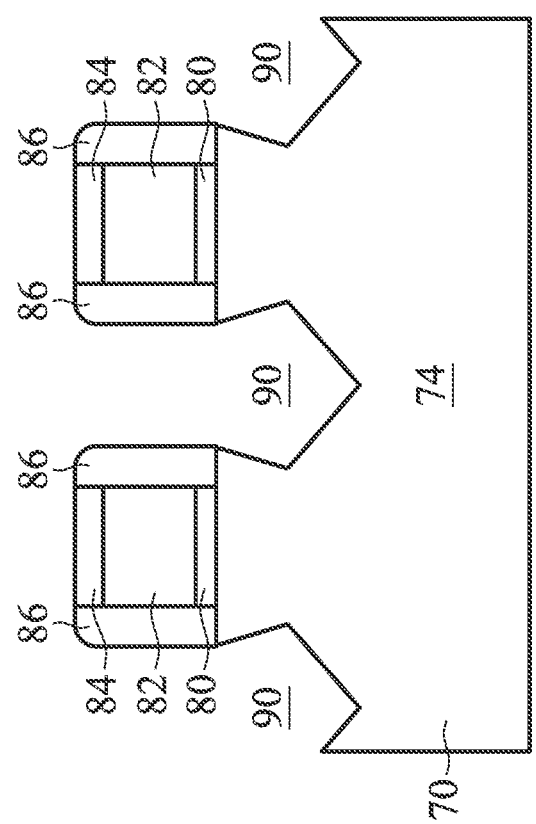

FIGS. 7A and 7B illustrate the formation of recesses 90 for source/drain regions. As illustrated, the recesses 90 are formed in the fins 74 on opposing sides of the gate stacks. The recessing can be by an etch process. The etch process can be isotropic or anisotropic, or further, may be selective with respect to one or more crystalline planes of the semiconductor substrate 70. Hence, the recesses 90 can have various cross-sectional profiles based on the etch process implemented. The etch process may be a dry etch, such as a RIE, NBE, or the like, or a wet etch, such as using tetramethylammonium hydroxide (TMAH), ammonium hydroxide (NH$_4$OH), or another etchant.

Figure 8B:
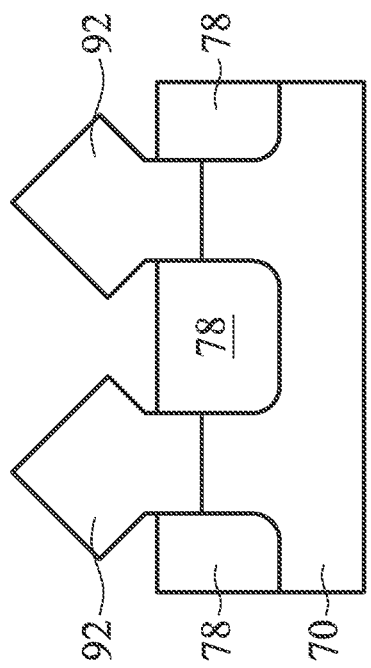
Figure 8A:
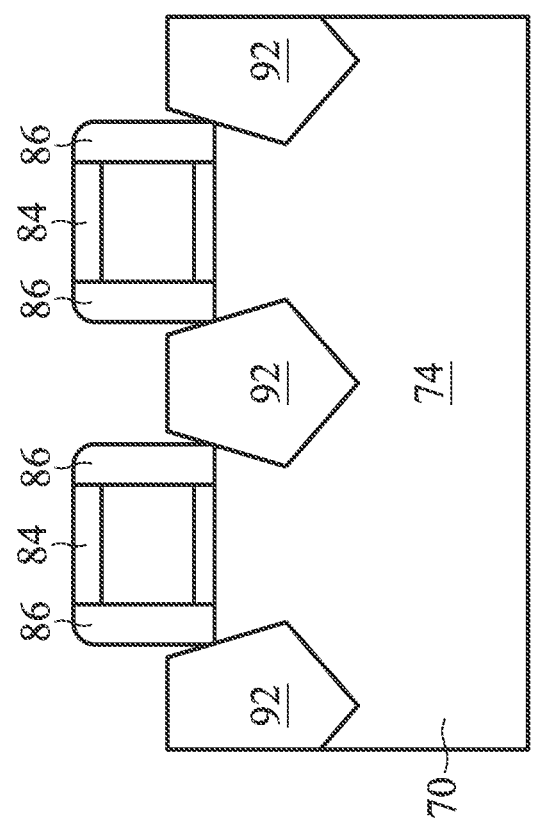

FIGS. 8A and 8B illustrate the formation of epitaxy source/drain regions 92 in the recesses 90. The epitaxy source/drain regions 92 may include or be silicon germanium (Si$_x$Ge$_{1-x}$ where x can be between approximately 0 and 1), silicon carbide, silicon phosphorus, silicon carbon phosphorus, pure or substantially pure germanium, a III-V compound semiconductor, a II-VI compound semiconductor, or the like. For example, materials for forming a III-V compound semiconductor include InAs, AlAs, GaAs, InP, GaN, InGaAs, InAlAs, GaSb, AlSb, AlP, GaP, and the like. The epitaxy source/drain regions 92 may be formed in the recesses 90 by epitaxially growing a material in the recesses 90, such as by metal-organic CVD (MOCVD), molecular beam epitaxy (MBE), liquid phase epitaxy (LPE), vapor phase epitaxy (VPE), selective epitaxial growth (SEG), the like, or a combination thereof. As illustrated in FIGS. 8A and 8B, due to blocking by the isolation regions 78, epitaxy source/drain regions 92 are first grown vertically in recesses 90, during which time the epitaxy source/drain regions 92 do not grow horizontally. After the recesses 90 are fully filled, the epitaxy source/drain regions 92 may grow both vertically and horizontally to form facets, which may correspond to crystalline planes of the semiconductor substrate 70. In some examples, different materials are used for epitaxy source/drain regions for p-type devices and n-type devices. Appropriate masking during the recessing or epitaxial growth may permit different materials to be used in different devices.

A person having ordinary skill in the art will also readily understand that the recessing and epitaxial growth of FIGS. 7A-B and 8A-B may be omitted, and that source/drain regions may be formed by implanting dopants into the fins 74 using the gate stacks and gate spacers 86 as masks. In some examples where epitaxy source/drain regions 92 are implemented, the epitaxy source/drain regions 92 may also be doped, such as by in situ doping during epitaxial growth and/or by implanting dopants into the epitaxy source/drain regions 92 after epitaxial growth. Example dopants for the source/drain regions can include or be, for example, boron for a p-type device and phosphorus or arsenic for an n-type device, although other dopants may be used. The epitaxy source/drain regions 92 (or other source/drain region) may have a dopant concentration in a range from about $10^{19}$ cm$^{-3}$ to about $10^{21}$ cm$^{-3}$. Hence, a source/drain region may be delineated by doping (e.g., by implantation and/or in situ during epitaxial growth, if appropriate) and/or by epitaxial growth, if appropriate, which may further delineate the active area in which the source/drain region is delineated.

Figure 9A:
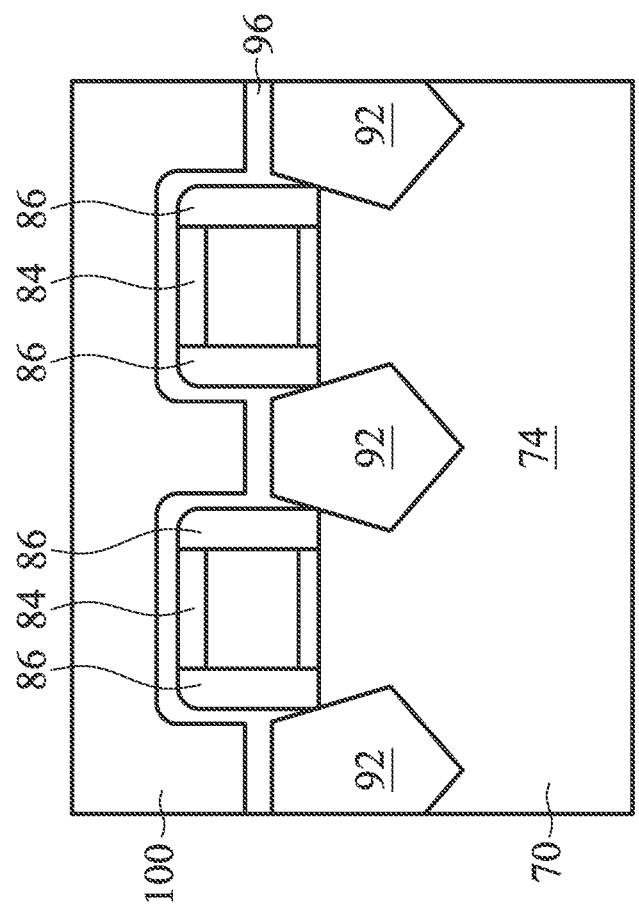
Figure 9B:
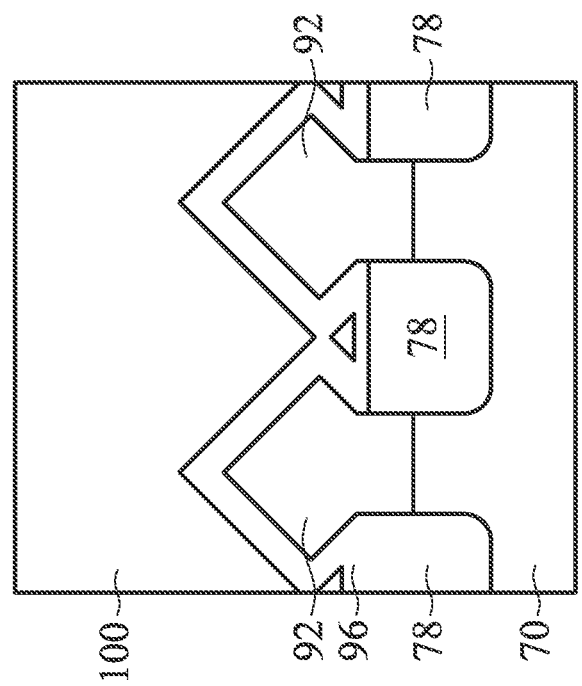

FIGS. 9A and 9B illustrate the formation of a contact etch stop layer (CESL) 96 and a first interlayer dielectric (ILD) 100 over the CESL 96. Generally, an etch stop layer can provide a mechanism to stop an etch process when forming, e.g., contacts or vias. An etch stop layer may be formed of a dielectric material having a different etch selectivity from adjacent layers or components. The CESL 96 is conformally deposited on surfaces of the epitaxy source/drain regions 92, sidewalls and top surfaces of the gate spacers 86, top surfaces of the mask 84, and top surfaces of the isolation regions 78. The CESL 96 may comprise or be silicon nitride, silicon carbon nitride, silicon carbon oxide, carbon nitride, the like, or a combination thereof, and may be deposited by CVD, PECVD, ALD, or another deposition technique. The first ILD 100 may comprise or be silicon dioxide, a low-k dielectric material (e.g., a material having a dielectric constant lower than silicon dioxide), such as silicon oxynitride, phosphosilicate glass (PSG), borosilicate glass (BSG), borophosphosilicate glass (BPSG), undoped silicate glass (USG), fluorinated silicate glass (FSG), organosilicate glasses (OSG), SiO$_x$C$_y$, Spin-On-Glass, Spin-On-Polymers, silicon carbon material, a compound thereof, a composite thereof, the like, or a combination thereof. The first ILD 100 may be deposited by spin-on, CVD, FCVD, PECVD, PVD, or another deposition technique.

The first ILD 100 may be planarized after being deposited, such as by a CMP. In a gate-first process, a top surface of the first ILD 100 may be above the upper portions of the CESL 96 and the gate stacks. Hence, the upper portions of the CESL 96 may remain over the gate stacks.

FIGS. 10A and 10B illustrate the formation of openings 102 through the first ILD 100 and the CESL 96 to the epitaxy source/drain regions 92 to expose at least portions of the epitaxy source/drain regions 92. The first ILD 100 and the CESL 96 may be patterned with the openings 102, for example, using photolithography and one or more etch processes.

FIGS. 10A and 10B further illustrate the formation of surface dopant regions 104 in respective upper portions of the epitaxy source/drain regions 92. The surface dopant regions 104 have high surface dopant concentrations at respective upper surfaces of the epitaxy source/drain regions 92. The surface dopant regions 104 are formed by implanting dopants into the upper portions of the epitaxy source/drain regions 92 using plasma doping (PLAD). Example dopants for the surface dopant regions 104 can include or be, for example, boron for a p-type device and phosphorus or arsenic for an n-type device, although other dopants may be used.

Each surface dopant region 104 can have a dopant concentration that is greater than the dopant concentration of the remainder of the epitaxy source/drain region 92 in which the surface dopant region 104 is disposed. The dopant concentration of the surface dopant region 104 can further have a concentration gradient, where any instance of a dopant concentration along the concentration gradient is greater than the dopant concentration of the remainder of the epitaxy source/drain region 92. A peak dopant concentration of the concentration gradient may be at or near the upper surfaces of the epitaxy source/drain region 92. The peak dopant concentration in the surface dopant region 104 can be at least one order of magnitude greater than the dopant concentration of the remainder of the epitaxy source/drain region 92, such as greater than two orders of magnitude. In some examples, a dopant concentration of the remainder of the epitaxy source/drain region 92 is about $1\times10^{20}$ cm$^{-3}$, and a peak dopant concentration in the surface dopant region 104 can be in a range from about $5\times10^{21}$ cm$^{-3}$ to about $10^{23}$ cm$^{-3}$, such as about $7>10^{21}$ cm$^{-3}$, about $1.5\times10^{22}$ cm$^{-3}$, or about $6\times10^{22}$ cm$^{-3}$. The concentration gradient can decrease in a direction away from the upper surfaces of the epitaxy source/drain region 92, such as at a rate of one decade decrease of dopant concentration per 5 nm or less of depth from the upper surfaces of the epitaxy source/drain region 92. For example, the concentration gradient can decrease one decade within a depth in a range from about 1 nm to about 5 nm, such as from about 2 nm to about 4 nm, and more particularly, about 2.5 nm. Additional details of the surface dopant regions 104, such as some dimensions and example concentration gradients, are described with respect to FIGS. 16 through 19 below.

The plasma doping can be performed in a plasma doping apparatus equipped with an inductively coupled plasma (ICP) source in some embodiments. An example plasma doping apparatus is the AMAT VIISta® PLAD available from Applied Materials®. The gas used in the plasma doping can include a mixture of a dopant source gas and a carrier (or dilution) gas. The dopant source gas can be any suitable dopant source gas, such as diborane ($B_2H_6$), e.g., to dope with boron, or arsine ($AsH_3$) and/or phosphine ($PH_3$), e.g., to dope with arsenic and/or phosphorus, respectively. The carrier (or dilution) gas can be, for example, hydrogen ($H_2$), helium (He), and/or argon (Ar). The dopant source gas can be in a range from about 0.3 percent to about 10 percent of the total flow rate of the mixture of the dopant source gas and the carrier gas. The flow rate of the mixture of gas during the plasma doping can be in a range from about 50 standard cubic centimeter per minute (sccm) to about 250 sccm. The pressure in the plasma doping apparatus during the plasma doping can be in a range from about 5 mTorr to about 20 mTorr. The plasma can be generated at a power in a range from about 200 W to about 625 W. A support substrate (e.g., on which the semiconductor substrate 70 is disposed) during the plasma doping can be biased at a DC bias at less than or equal to 1 kV, such as in a range from about 0.1 kV to about 1 kV. An implant dose, such as measured by a Faraday cup in the plasma doping apparatus, can be in a range from about $10^{15}$ cm$^{-2}$ to about $5\times10^{17}$ cm$^{-2}$, such as, for example, $5\times10^{16}$ cm$^{-2}$ or $10^{17}$ cm$^{-2}$.

After the plasma doping, an anneal is performed to activate the dopants in the surface dopant regions 104. The anneal, in some examples, may be a millisecond anneal, a laser anneal, or the like. The anneal may have a low thermal budget, such as at a temperature less than 400° C., for example, which may not cause significant out-diffusion of the dopants in the surface dopant regions 104, in some examples. The anneal, in some examples, may be a spike anneal, such as at a temperature greater than 800° C.

Optionally, an amorphization implant may be performed. In some examples, the amorphization implant includes implanting an impurity species into the epitaxy source/drain regions 92 to make at least upper portions of the surface dopant regions 104 of the epitaxy source/drain regions 92 amorphous. The upper portions of the surface dopant regions 104 that are made amorphous can extend from respective upper surfaces of the epitaxy source/drain regions 92 to a depth in a range from about 2 nm to about 20 nm, for example. In some examples, such as for a p-type device, the epitaxy source/drain regions 92 are $Si_xGe_{1-x}$, and germanium is the species implanted to amorphize the upper portions of the surface dopant regions 104 of the epitaxy source/drain regions 92. In some examples, such as for an n-type device, the epitaxy source/drain regions 92 are $Si_xP_{1-x}$, and an arsenic-containing (e.g., $Si_xAs_{1-x}$) species is the species implanted to amorphize the upper portions of the surface dopant regions 104 of the epitaxy source/drain regions 92. In such examples, the implant energy can be in a range from about 1 keV to about 15 keV, such as about 10 keV, with a dosage concentration in a range from about $5\times10^{13}$ cm$^{-2}$ to about $5\times10^{14}$ cm$^{-2}$.

Figure 11B:
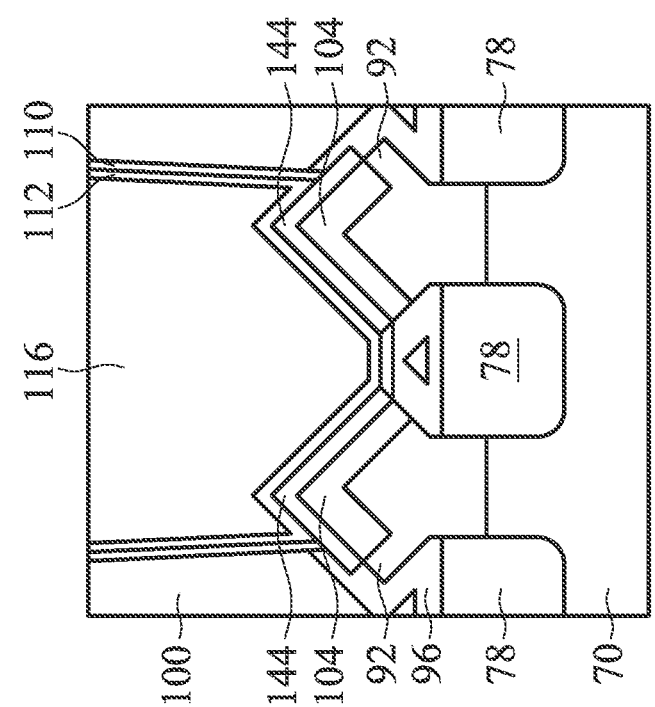
Figure 11A:
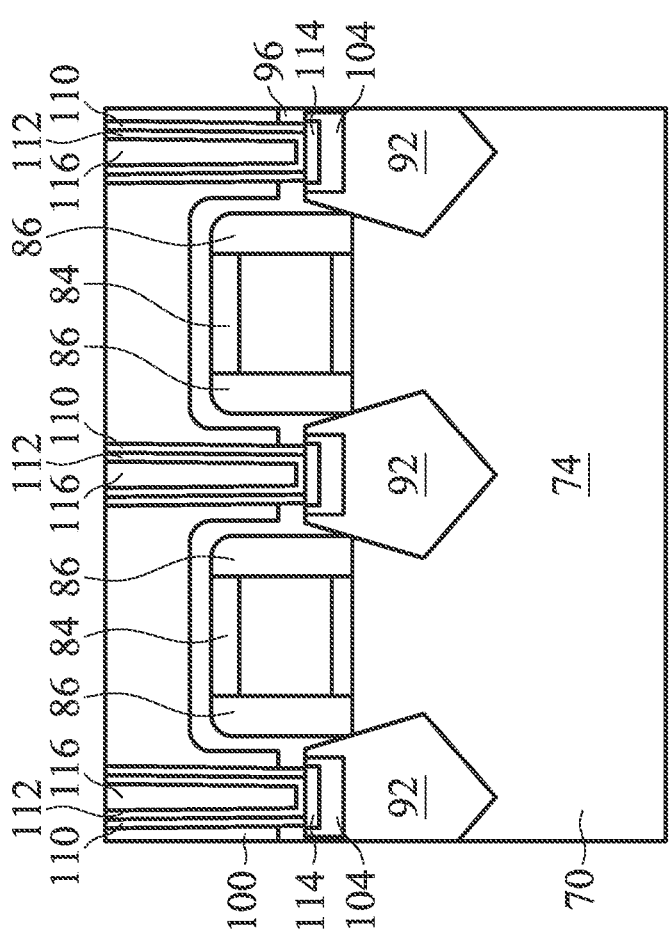

FIGS. 11A and 11B illustrate the formation of conductive features in the openings 102 to the epitaxy source/drain regions 92. Each conductive feature, as illustrated, includes an adhesion layer 110, a barrier layer 112 on the adhesion layer 110, and conductive material 116 on the barrier layer 112, for example. In some examples, each conductive feature may further include a silicide region 114 on the respective surface dopant region 104 of the epitaxy source/drain region 92, as illustrated.

The adhesion layer 110 can be conformally deposited in the openings 102 (e.g., on exposed surfaces of the epitaxy source/drain regions 92) and over the first ILD 100. The adhesion layer 110 may be or comprise titanium, tantalum, the like, or a combination thereof, and may be deposited by ALD, CVD, or another deposition technique. The barrier layer 112 can be conformally deposited on the adhesion layer 110, such as in the openings 102 and over the first ILD 100. The barrier layer 112 may be or comprise titanium nitride, titanium oxide, tantalum nitride, tantalum oxide, the like, or a combination thereof, and may be deposited by ALD, CVD, or another deposition technique.

Silicide regions 114 may be formed on the surface dopant regions 104 of the epitaxy source/drain regions 92 by reacting upper portions of the surface dopant regions 104 of the epitaxy source/drain regions 92 (which may be amorphized as described above with respect to FIGS. 10A-B) with the adhesion layer 110, and possibly, the barrier layer 112. An anneal can be performed to facilitate the reaction of the epitaxy source/drain regions 92 with the adhesion layer 110 and/or barrier layer 112. The anneal can be, for example, a rapid thermal anneal (RTA) at a temperature in a range from about 400° C. to about 650° C., such as about 500° C., for a duration in a range from about 10 seconds to about 60 seconds. The anneal may further re-crystallize any of the epitaxy source/drain regions 92 that was amorphous.

The conductive material 116 can be deposited on the barrier layer 112 and fill the openings 102. The conductive material 116 may be or comprise tungsten, cobalt, copper, ruthenium, aluminum, gold, silver, alloys thereof, the like, or a combination thereof, and may be deposited by CVD, ALD, PVD, or another deposition technique. After the conductive material 116 is deposited, excess conductive material 116, barrier layer 112, and adhesion layer 110 may be removed by using a planarization process, such as a CMP, for example. The planarization process may remove excess conductive material 116, barrier layer 112, and adhesion layer 110 from above a top surface of the first ILD 100. Hence, top surfaces of the conductive features and the first ILD 100 may be coplanar. The conductive features may be or may be referred to as contacts, plugs, etc.

FIGS. 12A-B through 15A-B are cross-sectional views of respective intermediate structures at intermediate stages in another example process of forming a semiconductor device in accordance with some embodiments. FIGS. 12A-B through 15A-B illustrate further aspects of a replacement gate process as described herein. Processing is first performed as described above with respect FIGS. 2A-B through 9A-B.

Figure 12A:
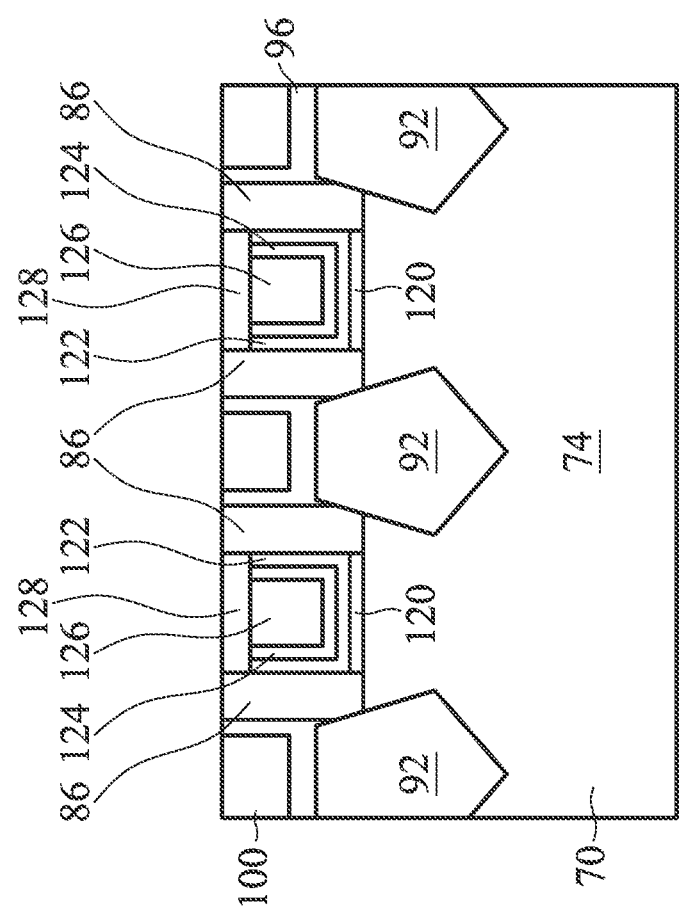
Figure 12B:
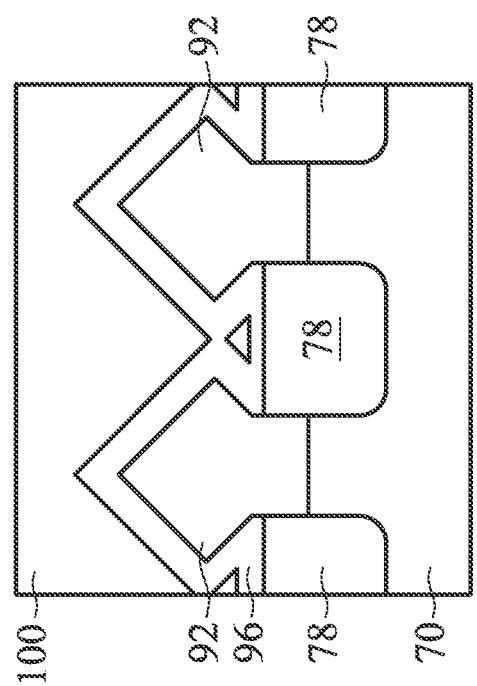

FIGS. 12A and 12B illustrate the replacement of gate stacks with replacement gate structures. The first ILD 100 and CESL 96 are formed with top surfaces coplanar with top surfaces of the gate layers 82. A planarization process, such as a CMP, may be performed to level the top surface of the first ILD 100 and CESL 96 with the top surfaces of the gate layers 82. The CMP may also remove the masks 84 (and, in some instances, upper portions of the gate spacers 86) on the gate layers 82. Accordingly, top surfaces of the gate layers 82 are exposed through the first ILD 100 and the CESL 96.

With the gate layers 82 exposed through the first ILD 100 and the CESL 96, the gate layers 82 are removed, such as by one or more etch processes. The gate layers 82 may be removed by an etch process selective to the gate layers 82, wherein the dielectric layers 80 act as etch stop layers, and subsequently, the dielectric layers 80 can optionally be removed by a different etch process selective to the dielectric layers 80. The etch processes can be, for example, a RIE, NBE, a wet etch, or another etch process. Recesses are formed between gate spacers 86 where the gate stacks are removed, and channel regions of the fins 74 are exposed through the recesses.

The replacement gate structures are formed in the recesses formed where the gate stacks were removed. The replacement gate structures each include, as illustrated, an interfacial dielectric 120, a gate dielectric layer 122, one or more optional conformal layers 124, and a gate electrode 126. The interfacial dielectric 120 is formed on sidewalls and top surfaces of the fins 74 along the channel regions. The interfacial dielectric 120 can be, for example, the dielectric layer 80 if not removed, an oxide (e.g., silicon oxide) formed by thermal or chemical oxidation of the fin 74, and/or an oxide (e.g., silicon oxide), nitride (e.g., silicon nitride), and/or another dielectric layer formed by CVD, ALD, MBD, or another deposition technique.

The gate dielectric layer 122 can be conformally deposited in the recesses where gate stacks were removed (e.g., on top surfaces of the isolation regions 78, on the interfacial dielectric 120, and sidewalls of the gate spacers 86) and on the top surfaces of the first ILD 100, the CESL 96, and gate spacers 86. The gate dielectric layer 122 can be or include silicon oxide, silicon nitride, a high-k dielectric material, multilayers thereof, or other dielectric material. A high-k dielectric material may have a k value greater than about 7.0, and may include a metal oxide of or a metal silicate of hafnium (Hf), aluminum (Al), zirconium (Zr), lanthanum (La), magnesium (Mg), barium (Ba), titanium (Ti), lead (Pb), multilayers thereof, or a combination thereof. The gate dielectric layer 122 can be deposited by ALD, PECVD, MBD, or another deposition technique.

The one or more optional conformal layers 124 can include one or more barrier and/or capping layers and one or more work-function tuning layers. The one or more barrier and/or capping layers can include tantalum nitride, titanium nitride, the like, or a combination thereof, and may be deposited by ALD, PECVD, MBD, or another deposition technique. The one or more work-function tuning layer may include or be aluminum titanium carbide, aluminum titanium oxide, aluminum titanium nitride, the like, or a combination thereof, and may be deposited by ALD, PECVD, MBD, or another deposition technique. In some examples, a capping layer (e.g., a TiN layer) is formed conformally on the gate dielectric layer 122; a first barrier layer (e.g., a TaN layer) is formed conformally on the capping layer; one or more work-function tuning layers are sequentially formed conformally on the first barrier layer; and a second barrier layer (e.g., a TiN layer) is formed on the one or more work-function tuning layers.

A layer for the gate electrodes 126 is formed over the one or more conformal layers 124, if implemented, and/or the gate dielectric layer 122. The layer for the gate electrodes 126 can fill remaining recesses where the gate stacks were removed. The layer for the gate electrodes 126 may be or comprise a metal-containing material such as tungsten, cobalt, aluminum, ruthenium, copper, multi-layers thereof, a combination thereof, or the like. The layer for the gate electrodes 126 can be deposited by ALD, PECVD, MBD, PVD, or another deposition technique. Portions of the layer for the gate electrodes 126, one or more conformal layers 124, and gate dielectric layer 122 above the top surfaces of the first ILD 100, the CESL 96, and gate spacers 86 are removed. For example, a planarization process, like a CMP, may remove the portions of the layer for the gate electrodes 126, one or more conformal layers 124, and gate dielectric layer 122 above the top surfaces of the first ILD 100, the CESL 96, and gate spacers 86. Subsequently, an etch-back may recess top surfaces of the gate electrodes 126, one or more conformal layers 124, and gate dielectric layer 122 to a level below the top surfaces of the first ILD 100, the CESL 96, and gate spacers 86. The etch-back may be a RIE, wet etch, or another etch process, for example. The replacement gate structures comprising the gate electrodes 126, one or more conformal layers 124, gate dielectric layer 122, and interfacial dielectric 120 may therefore be formed as illustrated in FIG. 12A.

A layer for masks 128 is formed over the gate electrodes 126, one or more conformal layers 124, and gate dielectric layer 122 (e.g., where the gate electrodes 126, one or more conformal layers 124, and gate dielectric layer 122 have been etched back) and over the first ILD 100, the CESL 96, and gate spacers 86. The layer for the masks 128 may include or be silicon oxynitride, silicon nitride, silicon carbide, silicon carbon nitride, the like, or a combination thereof, and may be deposited by CVD, PVD, ALD, or another deposition technique. Portions of the layer for the masks 128 above the top surfaces of the first ILD 100, the CESL 96, and gate spacers 86 are removed. For example, a planarization process, like a CMP, may remove the portions of the layer for masks 128 above the top surfaces of the first ILD 100, the CESL 96, and gate spacers 86, and the top surfaces of the masks 128 may be formed coplanar with the top surfaces of the first ILD 100, the CESL 96, and gate spacers 86.

FIGS. 13A and 13B illustrate the formation of a second ILD 130 over the first ILD 100, masks 128, gate spacers 86, and CESL 96. Although not illustrated, in some examples, an etch stop layer may be deposited over the first ILD 100, etc., and the second ILD 130 may be deposited over the ESL. If implemented, the etch stop layer may comprise or be silicon nitride, silicon carbon nitride, silicon carbon oxide, carbon nitride, the like, or a combination thereof, and may be deposited by CVD, PECVD, ALD, or another deposition technique. The second ILD 130 may comprise or be silicon dioxide, a low-k dielectric material, such as silicon oxynitride, PSG, BSG, BPSG, USG, FSG, OSG, $SiO_xC_y$, Spin-On-Glass, Spin-On-Polymers, silicon carbon material, a compound thereof, a composite thereof, the like, or a combination thereof. The second ILD 130 may be deposited by spin-on, CVD, FCVD, PECVD, PVD, or another deposition technique.

FIGS. 14A and 14B illustrate the formation of openings 132 through the second ILD 130, the first ILD 100, and the CESL 96 to the epitaxy source/drain regions 92 to expose at least portions of the epitaxy source/drain regions 92, as an example. The second ILD 130, the first ILD 100, and the CESL 96 may be patterned with the openings 132, for example, using photolithography and one or more etch processes.

FIGS. 14A and 14B further illustrate the formation of surface dopant regions 134 in respective upper portions of the epitaxy source/drain regions 92. The surface dopant regions 134 have high surface dopant concentrations at respective upper surfaces of the epitaxy source/drain regions 92. The surface dopant regions 134 are formed by implanting dopants into the upper portions of the epitaxy source/drain regions 92 using plasma doping (PLAD), as described above with respect to the surface dopant regions 104 in FIGS. 10A-B. After the plasma doping, an anneal is performed to activate the dopants in the surface dopant regions 134, as also described above with respect to FIGS. 10A-B. Optionally, an amorphization implant may be performed. In some examples, the amorphization implant includes implanting an impurity species into the epitaxy source/drain regions 92 to make at least upper portions of the surface dopant regions 134 of the epitaxy source/drain regions 92 amorphous. For brevity, description of the plasma doping, the resulting surface dopant regions 134, the anneal, and amorphization implant is not repeated here.

Figure 15B:
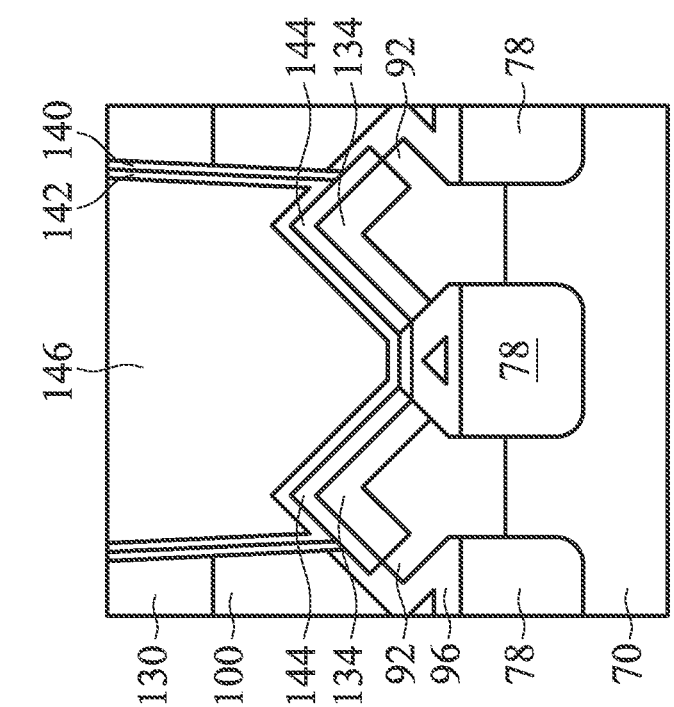
Figure 15A:
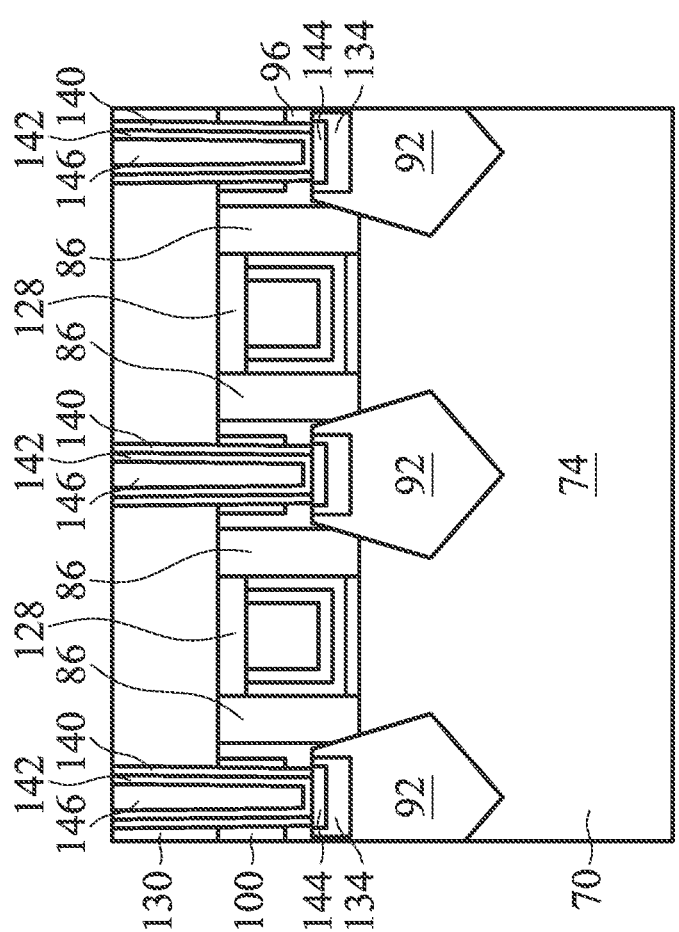

FIGS. 15A and 15B illustrate the formation of conductive features in the openings 132 to the epitaxy source/drain regions 92. Each conductive feature, as illustrated, includes an adhesion layer 140, a barrier layer 142 on the adhesion layer 140, and conductive material 146 on the barrier layer 142, for example. In some examples, each conductive feature may further include a silicide region 144 on the respective surface dopant region 134 of the epitaxy source/drain region 92, as illustrated.

The adhesion layer 140 can be conformally deposited in the openings 132 (e.g., on exposed surfaces of the epitaxy source/drain regions 92) and over the second ILD 130. The barrier layer 142 can be conformally deposited on the adhesion layer 140, such as in the openings 132 and over the second ILD 130. Silicide regions 144 may be formed on the surface dopant regions 134 of the epitaxy source/drain regions 92 by reacting upper portions of the surface dopant regions 134 of the epitaxy source/drain regions 92 (which may be amorphized as described above with respect to FIGS. 14A-B) with the adhesion layer 140, and possibly, the barrier layer 142. The conductive material 146 can be deposited on the barrier layer 142 and fill the openings 132. After the conductive material 146 is deposited, excess conductive material 146, barrier layer 142, and adhesion layer 140 may be removed by using a planarization process, such as a CMP, for example. The planarization process may remove excess conductive material 146, barrier layer 142, and adhesion layer 140 from above a top surface of the second ILD 130. Hence, top surfaces of the conductive features and the second ILD 130 may be coplanar. The conductive features may be or may be referred to as contacts, plugs, etc. The conductive features can be formed using processes and materials as described above with respect to FIGS. 11A-B, and hence, such description is omitted here for brevity.

FIG. 16 illustrates a portion of the cross-sectional view of FIG. 14A to further illustrate additional details in accordance with some embodiments. The additional details, in some examples, apply equally to the cross-sectional view of FIG. 10A and its corresponding features. The opening 132 through the second ILD 130, first ILD 100, and CESL 96 to the epitaxy source/drain region 92 has a first dimension D1 in a plane of the top surface of the second ILD 130 and in a direction extending perpendicularly from one replacement gate structure to a neighboring replacement gate structure. The opening 132 also has a second dimension D2 from the plane of the top surface of the second ILD 130 to a top surface of the epitaxy source/drain region 92. The opening 132 further has a third dimension D3 along the top surface of the epitaxy source/drain region 92 and in a direction extending perpendicularly from one replacement gate structure to a neighboring replacement gate structure. The first dimension D1 can be in a range from about 10 nm to about 30 nm; the second dimension D2 can be in a range from about 50 nm to about 100 nm; and the third dimension D3 can be in a range from about 8 nm to about 30 nm. A ratio of the second dimension D2 to the first dimension D1 (e.g., an aspect ratio) can be greater than 2, such as in a range from about 2 to about 10. A ratio of the second dimension D2 to the third dimension D3 can be in a range from about 2 to about 10.

The surface dopant region 134 extends laterally a fourth dimension D4 along the top surface of the epitaxy source/drain region 92 and in a direction extending perpendicularly from one replacement gate structure to a neighboring replacement gate structure. The surface dopant region 134 extends a fifth dimension D5 from an upper surface of the epitaxy source/drain region 92 into the epitaxy source/drain region 92. The epitaxy source/drain region 92 extends a sixth dimension D6 from the upper surface of the epitaxy source/drain region 92 to a bottom of the epitaxy source/drain region 92. The fourth dimension D4 can be in a range from about 10 nm to about 40 nm; the fifth dimension D5 can be in a range from about 2 nm to about 20 nm; and the sixth dimension D6 can be in a range from about 20 nm to about 70 nm. A ratio of the fourth dimension D4 to the third dimension D3 can be greater than 1, such as in a range from about 1 to about 1.3. A ratio of the fourth dimension D4 to the fifth dimension D5 can be greater than 2, such as in a range from about 2 to about 5. A ratio of the fifth dimension D5 to the sixth dimension D6 can be less than 0.3, such as in a range from about 0.1 to about 0.3. In the illustrated example, the fifth dimension D5 is less than the sixth dimension D6, but as described subsequently, the fifth dimension D5 can be equal to or greater than the sixth dimension D6.

FIG. 17 illustrates a portion of the cross-sectional view of FIG. 15A to further illustrate additional details in accordance with some embodiments. The additional details, in some examples, apply equally to the cross-sectional view of FIG. 11A and its corresponding features. The dimensions D1 through D6 in FIG. 16 generally apply to the features of FIG. 17. In some instances, the second dimension D2 may be reduced during processing from FIG. 16 to FIG. 17, such as due to some loss from a CMP in forming the conductive feature comprising the conductive material 146, etc. Further, dopants of the surface dopant region 134 may diffuse away from the surface dopant region 134 during one or more anneal processes, but in some examples, low thermal budgets during those anneal processes do not result in significant diffusion of dopants from the surface dopant region 134. Hence, in some embodiments, dopants may be well confined in the surface dopant region 134.

The silicide region 144 extends a seventh dimension D7 from an upper surface of the epitaxy source/drain region 92 into the epitaxy source/drain region 92. The seventh dimension D7 can be in a range from about 2 nm to about 10 nm. A ratio of the fifth dimension D5 to the seventh dimension D7 can be greater than 1, such as in a range from about 1 to about 5. A ratio of the sixth dimension D6 to the seventh dimension D7 can be less than 30, such as in a range from about 5 to about 30. In the illustrated example, the seventh dimension D7 is less than the fifth dimension D5 and the sixth dimension D6, but in other examples, the seventh dimension D7 can be equal to or greater than the fifth dimension D5 and/or the sixth dimension D6.

Figure 18:
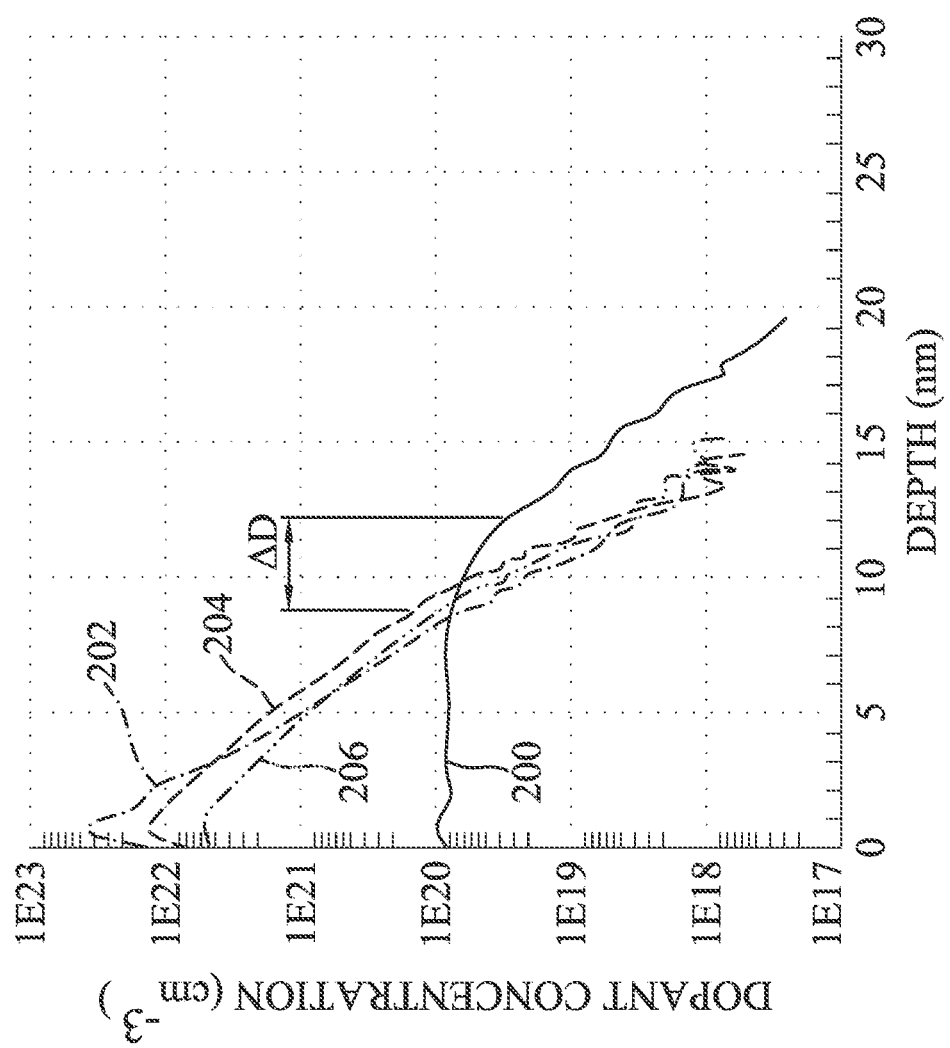
FIG. 18 is a graph illustrating various dopant profiles in accordance with some embodiments.

FIG. 18 is a graph illustrating various dopant profiles in accordance with some embodiments. The graph illustrates dopant concentration as a function of depth (e.g., vertical depth) from a top surface of, e.g., the epitaxy source/drain region 92 into the epitaxy source/drain region 92, like shown in the directions of the fifth dimension D5 and sixth dimension D6 of FIG. 16. For purposes of illustration, the dopant and the intrinsic material of the epitaxy source/drain region 92 are boron and SiGe, respectively, in these examples. Other materials and dopants may be used and have corresponding features.

A first profile 200 illustrates a dopant concentration of the epitaxy source/drain region 92, where the epitaxy source/drain region 92 is formed according to processes described above except without the plasma doping of FIGS. 10A-B and 14A-B. The epitaxy source/drain region 92 is formed by epitaxially grown SiGe and in situ doping boron during the epitaxial growth. The dopant concentration of boron in the first profile 200 is about $1\times10^{20}$ cm$^{-3}$ in the epitaxy source/drain region 92.

A second profile 202 illustrates a dopant concentration formed from a first plasma doping process, such as to form the surface dopant regions 104 and 134. The first plasma doping process uses a gas mixture, where 3 percent of the total flow rate of the gas mixture is the dopant source gas (diborane ($B_2H_6$) in this example). The substrate during this first plasma doping process is biased at a DC bias of 0.3 kV. The implant dose is about $5\times10^{16}$ cm$^{-2}$, as counted by a Faraday cup in the plasma doping chamber. As can be seen from the second profile 202, a peak dopant concentration of the second profile 202 is about $5\times10^{22}$ cm$^{-3}$, and the concentration gradient of the second profile 202 decreases at a rate of 1 decade per about 2.5 nm.

A third profile 204 illustrates a dopant concentration formed from a second plasma doping process, such as to form the surface dopant regions 104 and 134. The second plasma doping process uses a gas mixture, where 1 percent of the total flow rate of the gas mixture is the dopant source gas (diborane ($B_2H_6$) in this example). The substrate during this second plasma doping process is biased at a DC bias of 0.3 kV. The implant dose is about $1\times10^{17}$ cm$^{-2}$, as counted by a Faraday cup in the plasma doping chamber. As can be seen from the third profile 204, a peak dopant concentration of the third profile 204 is about $1.5\times10^{22}$ cm$^{-3}$, and the concentration gradient of the third profile 204 decreases at a rate of 1 decade per about 4 nm.

A fourth profile 206 illustrates a dopant concentration formed from a third plasma doping process, such as to form the surface dopant regions 104 and 134. The third plasma doping process uses a gas mixture, where 0.5 percent of the total flow rate of the gas mixture is the dopant source gas (diborane ($B_2H_6$) in this example). The substrate during this third plasma doping process is biased at a DC bias of 0.3 kV. The implant dose is about $1\times10^{17}$ cm$^{-2}$, as counted by a Faraday cup in the plasma doping chamber. As can be seen from the fourth profile 206, a peak dopant concentration of the fourth profile 206 is about $6\times10^{22}$ cm$^{-3}$, and the concentration gradient of the fourth profile 206 decreases at a rate of 1 decade per less than 5 nm.

Combining the dopant doped in situ during epitaxial growth of the epitaxy source/drain region 92 and the dopant doped by any of the processes of the profiles 202, 204, and 206 generally results in a dopant profile that (1) corresponds to the respective profile 202, 204, and 206 between the upper surface of the epitaxy source/drain region 92 (e.g., depth 0) and a depth at which the respective profile 202, 204, and 206 intersects the first profile 200, and (2) corresponds to the first profile 200 from the depth of the intersection and beyond. Generally, the portion of the respective profile 202, 204, and 206 from the upper surface of the epitaxy source/drain region 92 (e.g., depth 0) to the depth at which the respective profile 202, 204, and 206 intersects the first profile 200 corresponds to the surface dopant regions 104 and 134, and the portion of the first profile 200 from the depth of the intersection and beyond corresponds to a remainder portion of the epitaxy source/drain region 92. For example, the graph of FIG. 18 illustrates a dimension difference ΔD that indicates at least a remainder portion of the epitaxy source/drain region 92 below the surface dopant region 104 or 134, assuming the respective processes for forming the first profile 200 and the second profile 202 are used. This dimension difference ΔD can correspond to the portion of the epitaxy source/drain region 92 below the surface dopant region 134 in FIGS. 16 and 17 in the direction of the fifth dimension D5 and sixth dimension D6.

As is apparent from these profiles 202, 204, and 206, a peak dopant concentration of the surface dopant regions 104 and 134 can be higher than a dopant concentration of the remainder of the epitaxy source/drain regions 92. From the peak dopant concentration, the dopant concentration decreases at a rate of 1 decade per about 5 nm or less.

Figure 19:
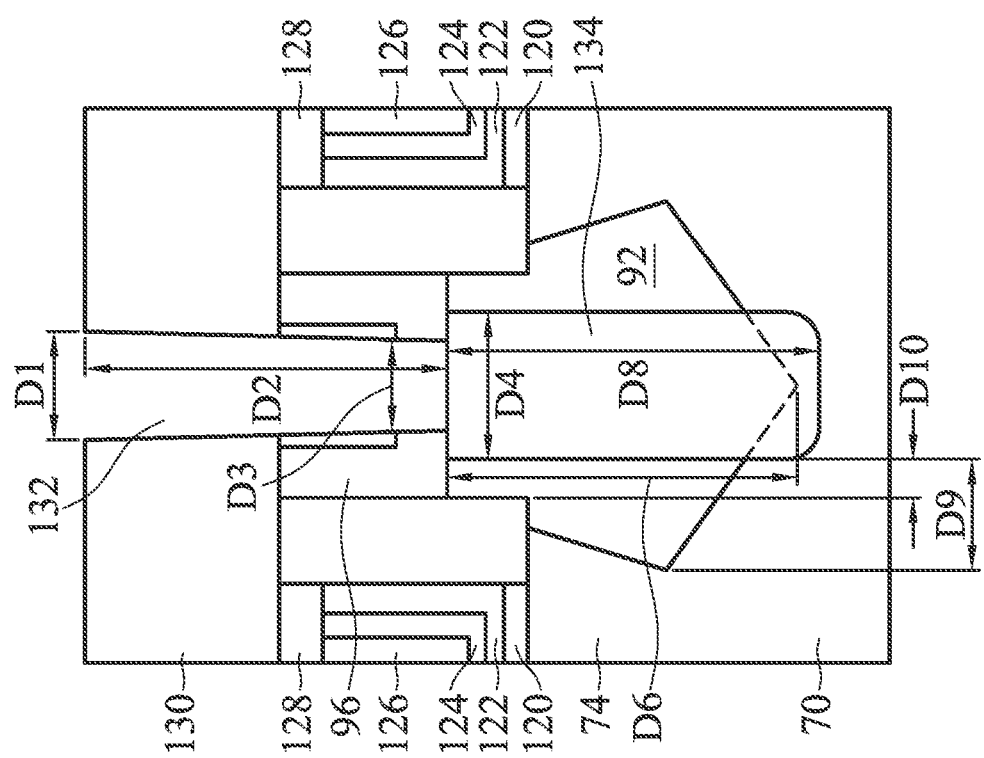
FIG. 19 is a modification of the cross-sectional view of FIG. 16 in accordance with some embodiments.

FIG. 19 illustrates a modification of the cross-sectional view of FIG. 16 in accordance with some embodiments. The surface dopant region 134 extends an eighth dimension D8 from an upper surface of the epitaxy source/drain region 92 into the epitaxy source/drain region 92. The eighth dimension D8 is greater than the sixth dimension D6. The eighth dimension D8 can be in a range from about 20 nm to about 100 nm. A ratio of the eighth dimension D8 to the sixth dimension D6 can be greater than 1, such as in a range from about 1 to about 1.5.

In the various illustrated examples, the depth of the surface dopant region 104 or 134 in relation to the epitaxy source/drain region 92 can vary. For example, the epitaxy source/drain region 92 can have varying sixth dimensions D6 based on recessing and/or epitaxial growth described above with respect to FIGS. 7A-B and 8A-B. Further, a width of the epitaxy source/drain region 92 (e.g., in the cross-section B-B shown in FIG. 8B) can affect a fifth dimension D5 and/or eighth dimension D8 of the surface dopant region 104 or 134 since the plasma doping is conformal. Even further, the process parameters of the plasma doping can affect the dopant profile, and hence, the surface dopant region 104 or 134, such as shown by the graph of FIG. 18.

Further, a dopant concentration of the surface dopant region 104 and 134 can decrease laterally similar to what is described above, such as in FIG. 18. This can result in a remainder portion of the epitaxy source/drain region 92 being laterally disposed from the surface dopant region 104 and 134, such as illustrated by a ninth dimension D9 in FIG. 19. The ninth dimension D9 can be in a range from about 10 nm to about 30 nm.

In the illustrated example, the epitaxy source/drain region 92 has a portion under the gate spacer 86, which may be included in the remainder portion of the epitaxy source/drain region 92 that is laterally disposed from the surface dopant region 104 and 134. This portion of the epitaxy source/drain region 92 under the gate spacer 86 may result from the recessing process to form the recess 90 in FIGS. 7A-B. In other examples, a different recess profile is implemented, and no portion of the epitaxy source/drain region 92 may be under the gate spacer 86. In such examples, a remainder portion of the epitaxy source/drain region 92 may still be laterally disposed from the surface dopant region 104 and 134, such as illustrated by a tenth dimension D10 in FIG. 19. The tenth dimension D10 can be in a range from about 1 nm to about 5 nm. The lateral disposal of a remainder portion of the epitaxy source/drain region 92 from the surface dopant region 104 and 134 may occur regardless of a fifth dimension D5 or eighth dimension D8 of the surface dopant region 104 and 134.

Some embodiments may achieve advantages. By using plasma doping to form surface dopant regions having a high surface dopant concentration at respective upper surfaces of source/drain regions, resistances of conductive features (e.g., contacts) formed to the respective source/drain regions can be decreased. Further, the abrupt decrease from the high surface dopant concentration can reduce out-diffusion of the dopants to regions, such as channel regions, that could have adverse impacts on devices, such as short channel effects. Hence, a high surface dopant concentration can be better constrained. Further, some embodiments may be implemented at small technology nodes, such as 7 nm, 5 nm, and beyond.

An embodiment is a structure. The structure includes an active area on a substrate, a dielectric layer over the active area, and a conductive feature through the dielectric layer to the active area. The active area includes a source/drain region. The source/drain region includes a surface dopant region at an upper surface of the source/drain region, and includes a remainder portion of the source/drain region having a source/drain dopant concentration. The surface dopant region includes a peak dopant concentration proximate the upper surface of the source/drain region. The peak dopant concentration is at least an order of magnitude greater than the source/drain dopant concentration. The conductive feature contacts the source/drain region at the upper surface of the source/drain region.

Another embodiment is a structure. The structure includes an active area on a substrate, a gate structure over the active area, a dielectric layer over the active area and the gate structure, and a conductive feature through the dielectric layer. The active area includes a source/drain region. The source/drain region includes a surface dopant region at an upper surface of the source/drain region. The surface dopant region includes a first dopant concentration. The source/drain region further includes a remainder portion of the source/drain region having a second dopant concentration. The first dopant concentration decreases in the surface dopant region to the second dopant concentration of the remainder portion of the source/drain region. The decrease of the first dopant concentration in the surface dopant region includes a decrease at a rate of 1 decade of concentration per 5 nm or less. The gate structure is proximate the source/drain region. The conductive feature is through the dielectric layer to the upper surface of the source/drain region.

A further embodiment is a method. A source/drain region is formed in an active area on a substrate. The source/drain region has a first dopant concentration. A dielectric layer is formed over the active area and the source/drain region. An opening is formed through the dielectric layer. The opening exposes at least a portion of an upper surface of the source/drain region. A surface dopant region is formed in the source/drain region at the upper surface of the source/drain region. Forming the surface dopant region includes plasma doping the source/drain region through the opening. The surface dopant region includes a second dopant concentration proximate the upper surface of the source/drain region. A conductive feature is formed in the opening to the surface dopant region in the source/drain region.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A structure comprising:
    an active area on a substrate, the active area comprising a source/drain region, the source/drain region comprising:
        a surface dopant region at an upper surface of the source/drain region, the surface dopant region comprising a first dopant, the surface dopant region having a peak dopant concentration of the first dopant proximate the upper surface of the source/drain region; and
        a remainder portion of the source/drain region having a source/drain dopant concentration of a second dopant, the peak dopant concentration of the first dopant being at least an order of magnitude greater than the source/drain dopant concentration of the second dopant;
    a dielectric layer over the active area; and
    a conductive feature through the dielectric layer to the active area and contacting the source/drain region at the upper surface of the surface dopant region.

2. The structure of claim 1, wherein the remainder portion extends along sidewalls of the surface dopant region.

3. The structure of claim 1, wherein the first dopant and the second dopant are a same dopant.

4. The structure of claim 1 further comprising a silicide region along an upper surface of the surface dopant region, wherein the silicide region is contained within the surface dopant region.

5. A structure comprising:
    an active area on a substrate, the active area comprising a source/drain region, the source/drain region comprising:
        a surface dopant region at an upper surface of the source/drain region, the surface dopant region comprising a first dopant concentration of a first dopant of a first conductivity type; and
        a remainder portion of the source/drain region having a second dopant concentration of a second dopant of the first conductivity type; and
        wherein the first dopant concentration decreases in the surface dopant region to the second dopant concentration of the remainder portion of the source/drain region, wherein the remainder portion extends to an upper surface of the source/drain region along opposing sides of the surface dopant region;
    a gate structure over the active area and proximate the source/drain region;
    a dielectric layer over the active area and the gate structure; and
    a conductive feature through the dielectric layer to the upper surface of the source/drain region.

6. The structure of claim 5, wherein the first dopant concentration has a concentration gradient decreasing at a rate of 1 decade per less than 5 nm from a peak concentration of the first dopant in the surface dopant region.

7. The structure of claim 5, wherein a first width of the surface dopant region is in a range from about 10 nm to about 40 nm.

8. The structure of claim 7, wherein a ratio of the first width to a width of a bottom surface of the conductive feature is in a range from about 1 to about 1.3.

9. The structure of claim 8, wherein a first depth of the surface dopant region is in a range from about 2 nm to about 20 nm.

10. The structure of claim 9, wherein a ratio of the first width to the first depth is in a range from about 2 to about 5.

11. The structure of claim 9, wherein a second depth of the remainder portion is in a range from about 20 nm to about 70 nm.

12. The structure of claim 11, wherein a ratio of the first depth to the second depth is in a range from about 0.1 to about 0.3.

13. The structure of claim 11 further comprising a silicide region along an upper surface of the surface dopant region, wherein the silicide region is contained within the surface dopant region.

14. The structure of claim 13, wherein a third depth of the silicide region is in a range from about 2 nm to about 10 nm.

15. The structure of claim 14, wherein a ratio of the first depth to the third depth is in a range from about 1 to about 5.

16. The structure of claim 15, wherein a ratio of the second depth to the third depth (D7) is in a range from about 5 to about 30.

17. A structure comprising:
 a surface dopant region at an upper surface of a semiconductor region, the surface dopant region comprising a first dopant concentration of a first dopant and a first peak dopant concentration of the first dopant, the first dopant having a first conductivity type; and
 a remainder portion of the semiconductor region having a second dopant concentration of a second dopant, the second dopant having the first conductivity type, wherein the first peak dopant concentration is at least an order of magnitude greater than the second dopant concentration, wherein the first dopant concentration decreases in the surface dopant region to the second dopant concentration of the remainder portion of the semiconductor region, wherein the remainder portion extends along a sidewall of the surface dopant region to an upper surface of the semiconductor region; and
 a conductive feature coupled to the upper surface of the semiconductor region.

18. The structure of claim 17, wherein the first dopant concentration has a concentration gradient decreasing at a rate of 1 decade per less than 5 nm from a peak concentration of the first dopant in the surface dopant region.

19. The structure of claim 17, wherein a first peak concentration of dopants of the first conductivity type in the remainder portion is about $1 \times 10^{20}$ cm$^{-3}$, and a second peak dopant concentration of dopants of the first conductivity type in the surface dopant region is in a range from about $5 \times 10^{21}$ cm$^{-3}$ to about $10^{23}$ cm$^{-3}$.

20. The structure of claim 17 further comprising a silicide region along an upper surface of the surface dopant region, wherein the silicide region is contained within the surface dopant region, wherein a ratio of a depth of the surface dopant region to a depth of the silicide region is in a range from about 1 to about 5.

* * * * *